United States Patent [19]
Takeuchi et al.

[11] Patent Number: 5,986,933
[45] Date of Patent: Nov. 16, 1999

[54] SEMICONDUCTOR MEMORY DEVICE HAVING VARIABLE NUMBER OF SELECTED CELL PAGES AND SUBCELL ARRAYS

[75] Inventors: Ken Takeuchi, Tokyo; Tomoharu Tanaka, Yokohama, both of Japan

[73] Assignee: Kabushiki Kaisha Toshiba, Kawashiki, Japan

[21] Appl. No.: 08/976,421

[22] Filed: Nov. 21, 1997

[30] Foreign Application Priority Data

Dec. 17, 1996 [JP] Japan ................................ 8-336529

[51] Int. Cl.$^6$ ................................................ G11C 16/04
[52] U.S. Cl. .............................. 365/185.12; 365/185.11; 365/185.17; 365/185.33
[58] Field of Search ...................... 365/185.12, 185.33, 365/185.17, 185.11

[56] References Cited

U.S. PATENT DOCUMENTS

| | | | |
|---|---|---|---|
| 5,379,256 | 1/1995 | Tanaka et al. | 365/185.17 |
| 5,430,675 | 7/1995 | Yajima et al. | 365/185.12 |
| 5,546,341 | 8/1996 | Suh et al. | 365/185.33 |
| 5,581,503 | 12/1996 | Matsubara et al. | 365/185.33 |
| 5,732,018 | 3/1998 | Choi et al. | 365/185.17 |
| 5,740,108 | 4/1998 | Okubo | 365/185.17 |
| 5,831,903 | 11/1998 | Ohuchi et al. | 365/185.12 |

FOREIGN PATENT DOCUMENTS 8-69696  3/1996  Japan .

Primary Examiner—David Nelms
Assistant Examiner—Gene N. Auduong
Attorney, Agent, or Firm—Banner & Witcoff, Ltd.

[57] ABSTRACT

A semiconductor memory device for easily optimizing a page size and a block size according to use in order to perform write, read and erase operations at the same time is provided. If a user inputs a command from outside using a memory device having a plurality of standard sub-cell arrays or if a short process step is added to memory devices at the time of their shipping, the page sizes for the read and write operations can freely be selected, and the write, read and erase units can be optimized according to use in a system design, therefore, the highest system performance can be achieved, and an advantage in compatibility of devices of different generations can be obtained.

35 Claims, 16 Drawing Sheets

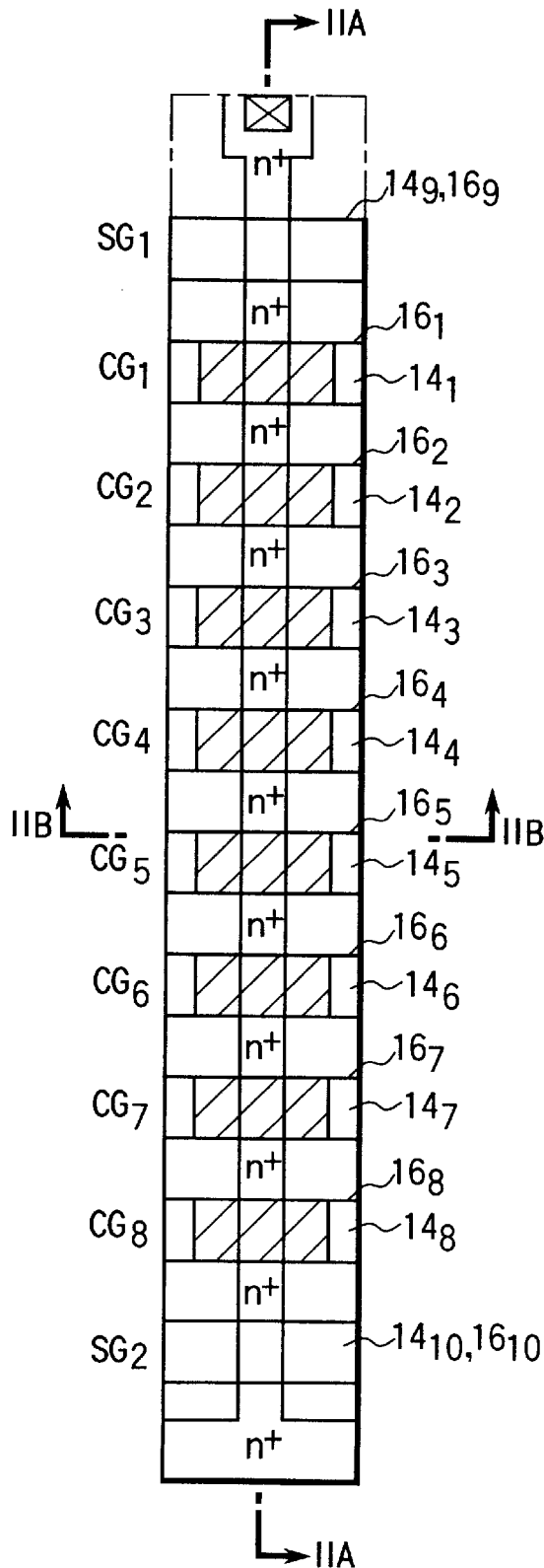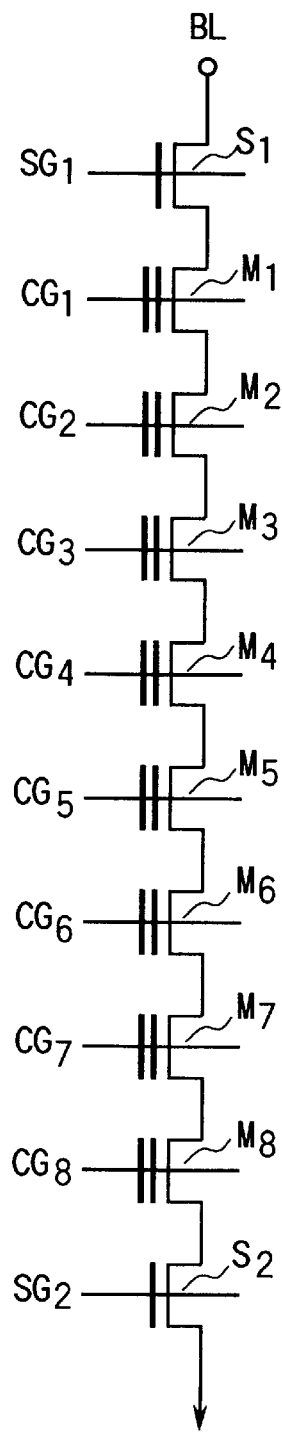
FIG. 1A
PRIOR ART
FIG. 1B
PRIOR ART

SEMICONDUCTOR MEMORY DEVICE HAVING VARIABLE NUMBER OF SELECTED CELL PAGES AND SUBCELL ARRAYS

BACKGROUND OF THE INVENTION

The present invention relates to a semiconductor memory device and more particularly to an electrically erasable programmable read only memory (hereinafter referred to as EEPROM).

An EEPROM having a NAND type cell structure is proposed as a conventional one. The EEPROM includes a plurality of memory cells each having an n-channel MOSFET in which a control gate and a floating gate are stacked one on another as a charge storage electrode. The memory cells are connected in series such that their adjacent ones share a source and drain. These memory cells as one unit are connected to a bit line. A plan view of one NAND cell is shown in FIG. 1A and its equivalent circuit is shown in FIG. 1B.

FIGS. 2A and 2B are cross-sectional views taken along lines IIA—IIA and IIB—IIB of FIG. 1A, respectively. A memory cell array constituted of a plurality of NAND cells is formed on a p-type silicon substrate (or p-well) 5 surrounded with a device isolation oxide film 6. The NAND cell of FIG. 1A is constituted of eight memory cells $M_1$ to $M_8$ connected in series shown in FIG. 1B.

As illustrated in FIG. 2B, each of the memory cells has a floating gate 14 formed on the substrate 5 with a gate insulator film 7 therebetween. As is apparent from FIGS. 1A and 2A, the floating gate 14 is one of a plurality of floating gates $14_1, 14_2, \ldots, 14_8$. The memory cells are connected in series such that adjacent ones share an $n^+$ diffusion layer 8 serving as both a source and a drain.

As illustrated in FIGS. 1A and 2A, first select gates $14_9$ and $16_9$ and second select gates $14_{10}$ and $16_{10}$ are formed on the drain and source sides of the NAND cell at the same time when the floating gate and control gate of each memory cell are done. The substrate 5 on which the NAND cell is formed, is covered with a CVD oxide film 10 and a bit line 11 is arranged thereon. In FIGS. 2A and 2B, reference numeral 9 indicates an oxide film for isolating the floating gate 14 and control gate 16 from each other.

The control gates 16 are continuously connected to their corresponding control gates of adjacent NAND cells in the row direction thereby to serve as word lines $CG_1$ to $CG_8$ shown in FIGS. 1A and 1B. The first select gates $14_9$ and $16_9$ are continuously connected in the row direction to serve as a select gate line SG1, as are the second select gates $14_{10}$ and $16_{10}$ to serve as a select gate line SG2. The select gates $14_9$, $16_9$, $14_{10}$ and $16_{10}$ are constituted by directly connecting the floating and control gates (not shown).

An equivalent circuit of the memory cell array having the above NAND cells arranged in matrix, is illustrated in FIG. 3. Each of source contacts of the NAND cells is connected to its corresponding source line for every group of, e.g., 64 bit lines, and the source line is connected to a reference voltage line formed of aluminum, polysilicon or the like. The reference voltage line is connected to a peripheral circuit. The control gate of the memory cell and the first and second select gates thereof are continuously connected in the row direction.

As shown in FIG. 3, a memory cell group connected to the control gates is usually called one page, while a group of pages between the first and second select lines connected to a pair of select gates on the drain and source is called one NAND block or one block.

For example, one page is constituted of 256-byte or 256×8 memory cells, which is called a page size. Data is written to the memory cells of one page at once. One block is constituted of, e.g., 2048-byte or 2048×8 memory cells. Data of the memory cells of one block is erased at once.

The constitution and operation of a row decoder for selecting a select gate and a control gate are described in a detail in Japanese Patent Application No. 6-218031.

FIGS. 4A and 4B illustrate a configuration of a prior art NAND type flash memory. As described above, data is written to/read out of the flash memory in units of one page, and data is erased therefrom in units of one block. When a cell array is not divided as shown in FIG. 4A, 256-byte memory cells connected to one word line constitute one page. When a cell array is divided into two cell arrays as shown in FIG. 4B, the memory cells connected to a word line of one of the two cell arrays constitute one page.

For example, the NAND type EEPROM operates as follows. Writing of Data starts from a memory cell farthest from the bit line. A boosted write voltage $V_{PP}$ (=about 20V) is applied to the control gate of a selected memory cell, and an intermediate voltage (=about 10V) is applied to the control gate and first select gate of a non-selected memory cell. A voltage of 0V ("0" writing) or an intermediate voltage ("1" writing) is applied to the bit line in accordance with the data.

The voltage of the bit line is transmitted to the selected memory cell. When data is "0", a high voltage is applied between the floating gate and substrate of the selected memory cell, electrons are tunnel-injected from the substrate to the floating gate, and the threshold voltage moves in the positive direction. When data is "1", no threshold voltage varies.

Data erasure is performed in units of one block. More specifically, all the control and select gates of a block of data to be erased are set to 0V, and a boosted voltage VPPE (about 20V) is applied to a p-well and an n-type substrate. The voltage $V_{PPE}$ is also applied to the control and select gates of a block of data not to be erased. If the voltage is so applied, electrons are emitted from the floating gate of the memory cell to the well, and the threshold voltage moves in the negative direction.

Data is read out as follows. The bit line is precharged and then goes into a floating state, the control gate of a selected memory cell is set to 0V, the control and select gates of the other memory cells are set to a power supply voltage $V_{CC}$ (e.g., 3V), and the source line is set to 0V. Whether current flows through the selected memory cell or not is detected by the bit line.

If data written to a memory cell is "0" (threshold voltage $V_{th}$ of the memory cell >0), the memory cell is turned off and thus the bit line maintains a precharge voltage. If the data is "1" ($V_{th}$<0), the memory cell is turned on and the bit line is decreased by $\Delta V$ from the precharge voltage. If the bit line voltage is sensed by a sense amplifier, data is read out of the memory cell.

In the semiconductor memory device including the above prior art NAND type EEPROM, the write operation is performed at once for the memory cells connected to the same word line (control gate). The larger the number of memory cells connected to the same word line (or the larger the page size), the higher the write speed per byte.

However, as the page size increases, the erase (block) size increases and the number of blocks included in one chip decreases. As a result, when a large amount of small-sized data, such as data stored in part of one block which is an erase unit, is stored, the amount of data stored in one chip reduces as the page size or the block size increases.

If the page size or the block size varies as the memory size of the EEPROM increases, the compatibility between generations of the memory is lost. For this reason, the design of a system using such a memory has to be changed whenever a generation changes if the page size or block size is varied.

BRIEF SUMMARY OF THE INVENTION

The present invention has been made with the view toward solving the aforementioned problems.

According to a first aspect of the present invention, there is provided a semiconductor memory device comprising a memory cell array having electrically erasable programmable memory cells arranged in matrix and word lines each formed by connecting gate electrodes of adjacent memory cells and serving as a select signal line of the memory cells. In this device, the number of memory cell pages selected simultaneously when a read or a write operation is performed, is variable, each of the memory cell pages includes a plurality of memory cells and is selected by a different word line respectively.

Favorably, the number of memory cell pages selected simultaneously is varied by a command input from outside a chip and is set to be same during read and write operations.

According to a second aspect of the present invention, there is provided a semiconductor memory device comprising a first mode in which N1 (N1 is a natural number) memory cell pages are selected simultaneously when a read or a write operation is performed, a second mode in which N2 (N2 is a natural number other than N1) memory cell pages are selected simultaneously when a read or a write operation is performed, and an i-th (i is a natural number not less than 2) mode in which Ni (Ni is a natural number) memory cell pages are selected simultaneously when a read or a write operation is performed. In this device, each of the memory cell pages selected simultaneously includes a plurality of memory cells and is selected by a different word line respectively.

Favorably, the plural modes are selected by a command input from outside a chip and the number of memory cell pages selected simultaneously is set to be same during read and write operations.

According to a third aspect of the present invention, there is provided a semiconductor memory device comprising a first mode in which N1 (N1 is a natural number) memory cell pages are selected simultaneously when a read or a write operation is performed, a second mode in which N2 (N2 is a natural number other than N1) memory cell pages are selected simultaneously when a read or a write operation is performed, and an i-th (i is a natural number not less than 2) mode in which Ni (Ni is a natural number) memory cell pages are selected simultaneously when a read or a write operation is performed. In this device, each of the memory cell pages selected simultaneously includes a plurality of memory cells and is selected by a different word line respectively, and one chip includes a k-th (k is a natural number not larger than i) memory cell group selected in a k-th mode and an m-th (m is a natural number other than k and not larger than i) memory cell group selected in an m-th mode.

Favorably, the first to i-th modes are selected by a command input from outside a chip.

According to a fourth aspect of the present invention, there is provided a semiconductor memory device comprising a memory cell array having electrically erasable programmable memory cells arranged in a matrix, word lines each formed by connecting gate electrodes of adjacent memory cells and serving as a select signal line of the memory cells, data lines for transmitting/receiving data to/from the memory cells, and data circuits coupled to the data lines, for holding write data or read data of the memory cells. In this device, the memory cell array includes a plurality of sub-cell arrays having different memory cells and being disposed with different word lines, different data lines and different data circuits respectively, and the number of sub-cell arrays to be selected simultaneously is variable when a read or a write operation is performed.

Favorably, the number of sub-cell arrays selected simultaneously is varied by a command input from outside a chip and is set to be same during read and write operations.

According to a fifth aspect of the present invention, there is provided a semiconductor memory device comprising data circuits connected to data lines, for holding write data of memory cells. In this device, a memory cell array includes a plurality of sub-cell arrays having different memory cells and being disposed different word lines, different data lines and different data circuits respectively, and the device comprises a first write mode in which write data is input to a 1·1-th data circuit of a 1·1-th sub-cell array and then data is written to a memory cell of the 1·1-th sub-cell array based on the write data input to the 1·1-th data circuit, a second write mode in which write data is input to a 2·1-th data circuit of a 2·1-th sub-cell array and a 2·2-th data circuit of a 2·2-th sub-cell array and then data is written to a memory cell of the 2·1-th sub-cell array and a memory cell of the 2·2-th sub-cell array based on the write data input to the 2·1-th data circuit and the 2·2-th data circuit, and an m-th (m is a natural number not less than 2) write mode in which write data is input to m·1-th to m·m-th data circuits of m·1-th to m·m-th sub-cell arrays and then data is written to memory cells of the m·1-th to m·m-th sub-cell arrays based on the write data input to the m·1-th to m·m-th data circuits where a j·k-th (j and k are each a natural number, $j \geq k \geq 1$) sub-cell array is a k-th sub-cell array selected in a j-th write mode and a j·k-th data circuit is included in the k-th sub-cell array.

Favorably, the first to m-th write modes are selected by a command input from outside a chip.

According to a sixth aspect of the present invention, there is provided a semiconductor memory device comprising data circuits coupled to data lines, for holding read data of memory cells. In this device, a memory cell array includes a plurality of sub-cell arrays having different memory cells and being disposed with different word lines, different data lines and different data circuits respectively, and the device comprises a first read mode in which data is read out from a memory cell of a 1·1-th sub-cell array to a 1·1-th data circuit and the data of the 1·1-th data circuit is transmitted outside the chip, a second read mode in which data is read out from memory cells of 2·1-th and 2·2-th sub-cell arrays to 2·1-th and 2·2-th data circuits and the data of the 2·1-th and 2·2-th data circuits is transmitted outside the chip, and an m-th (m is a natural number not less than 2) read mode in which data is read out from memory cells of m·1-th to m·m-th sub-cell arrays to m·1-th to m·m-th data circuits and the data of the m·1-th to m·m-th data circuits is transmitted outside the chip where a j·k-th (j and k are each a natural number, $j \geq k \geq 1$) sub-cell array is a k-th sub-cell array selected in a j-th read mode and a j·k-th data circuit is included in the k-th sub-cell array.

Favorably, the first to m-th read modes are selected by a command input from outside the chip.

According to a seventh aspect of the present invention, there is provided a semiconductor memory device in which first write data is input to a 1·1-th data circuit of a 1·1-th sub-cell array and data is written to a memory cell of the 1·1-th sub-cell array based on the first write data input to the 1·1-th data circuit, second write data is input to a 2·1-th data circuit of a 2·1-th sub-cell array and a 2·2-th data circuit of a 2·2-th sub-cell array and data is written to a memory cell of the 2·1-th sub-cell array and a memory cell of the 2·2-th sub-cell array based on the second write data input to the 2·1-th data circuit and the 2·2-th data circuit, n-th (n is a natural number not less than 2) write data is input to n·1-th to n·n-th data circuits of n·1-th to n·n-th sub-cell arrays and data is written to memory cells of the n·1-th to n·n-th sub-cell arrays based on the n-th write data input to the n·1-th to n·n-th data circuits, and k-th (k is a natural number not larger than n) write data and m-th (m is a natural number not larger than n and different from k) write data having different configuration units are stored in one chip.

In the semiconductor memory device of the present invention, the memory cells are nonvolatile memory cells each having a charge storage electrode, and the gate electrodes are control gates of the memory cells, and a plurality of memory cells are connected in series to constitute a NAND cell structure.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a plan view of a cell structure of a prior art NAND type EEPROM;

FIG. 1B is a diagram of an equivalent circuit of a cell of the prior art NAND type EEPROM;

DETAILED DESCRIPTION OF THE INVENTION

Embodiments of the present invention will now be described with reference to the accompanying drawings.

Figure 2A:
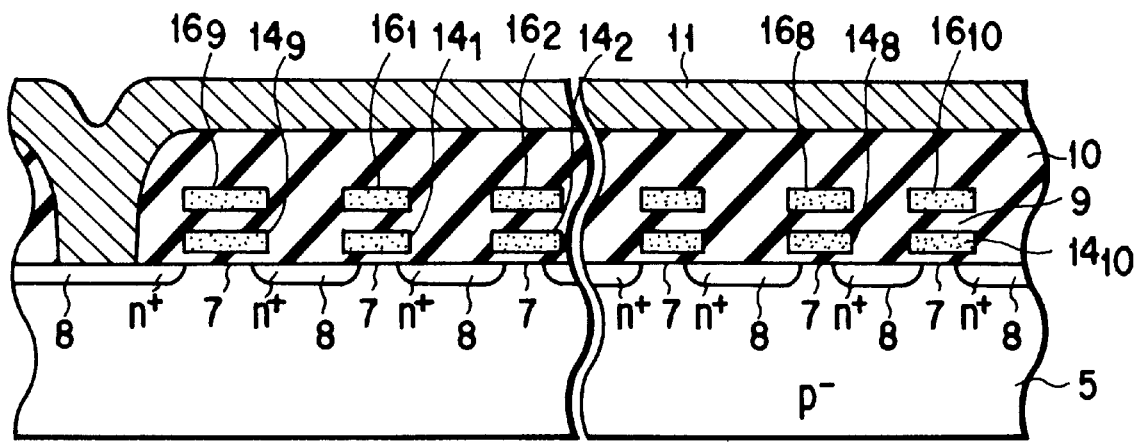
FIG. 2A is a cross-sectional view of a cell of the prior art NAND type EEPROM.
Figure 2B:
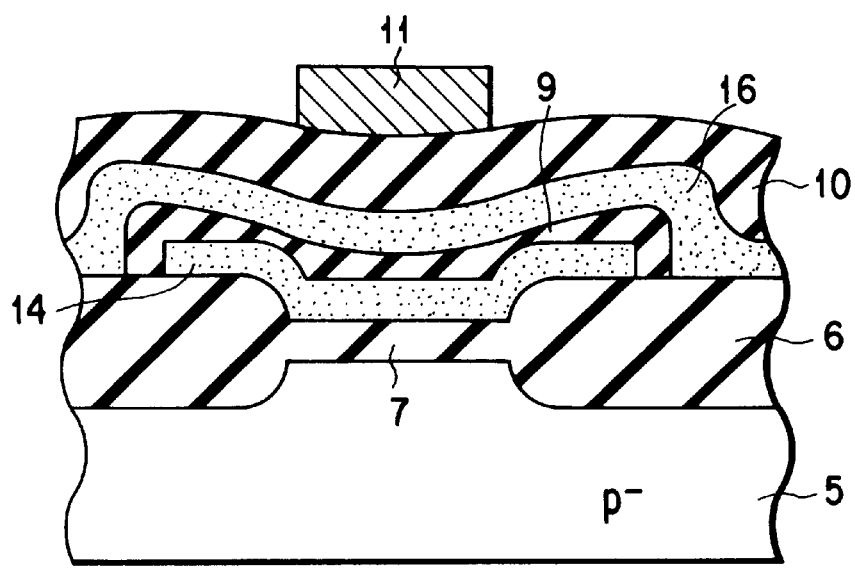
FIG. 2B is another cross-sectional view of the cell of the prior art NAND type EEPROM.
Figure 3:
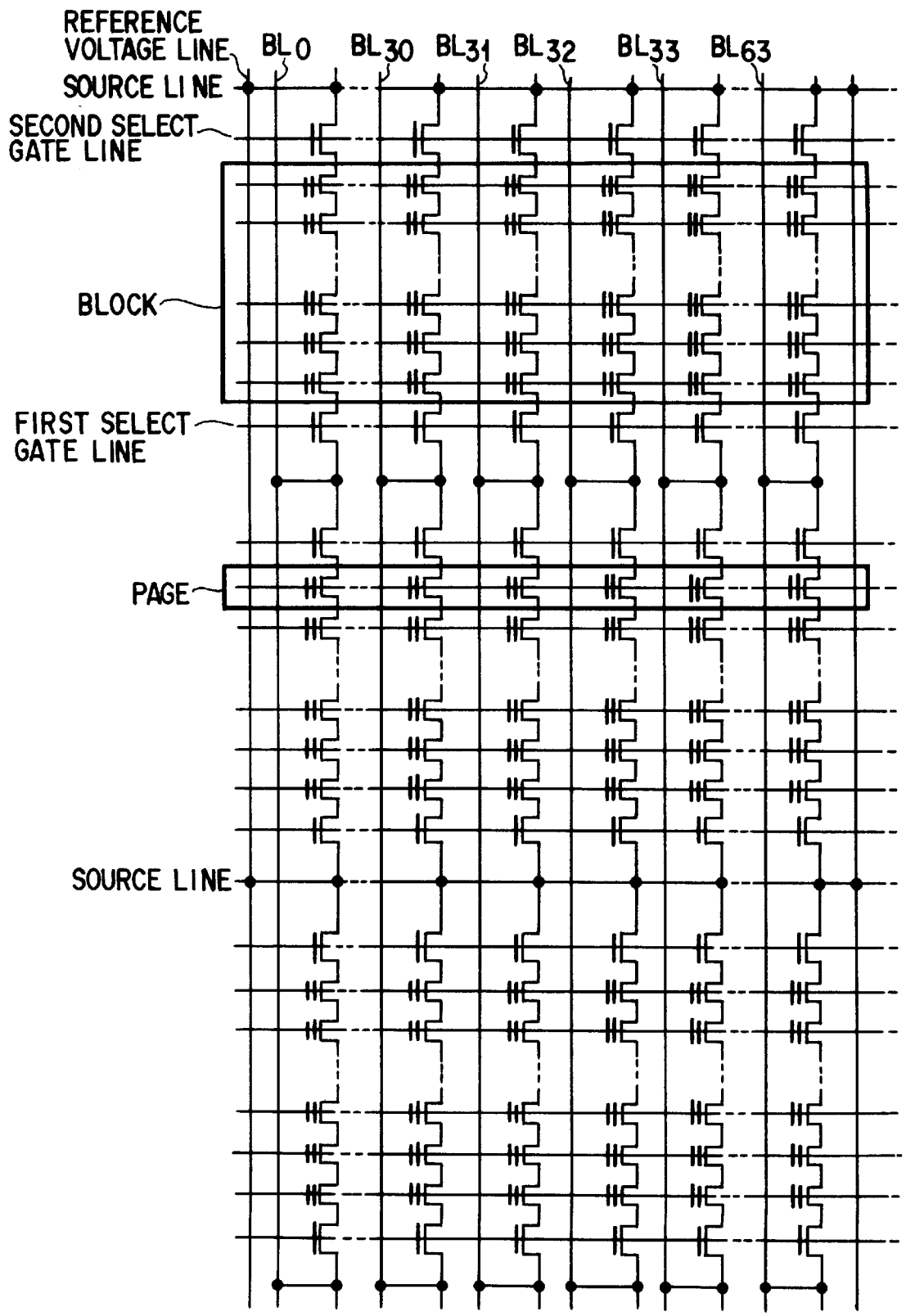
FIG. 3 is an equivalent circuit diagram of a memory cell array of the prior art NAND type EEPROM.
Figure 4A:
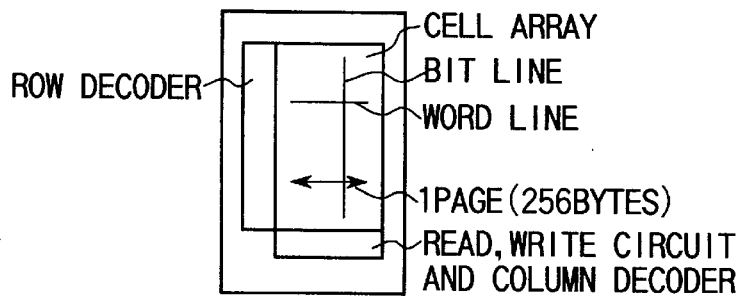
FIG. 4A is a block diagram of a prior art memory cell array which is not divided.
Figure 4B:
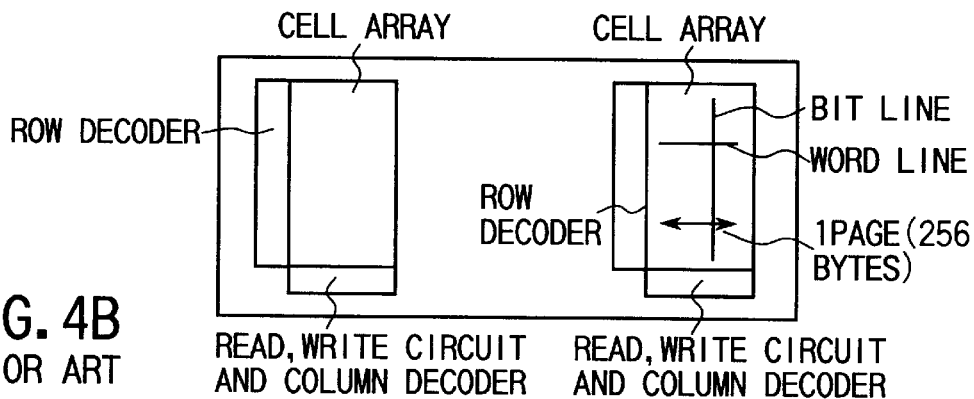
FIG. 4B is a block diagram of a prior art memory cell array which is divided into two.
Figure 5:
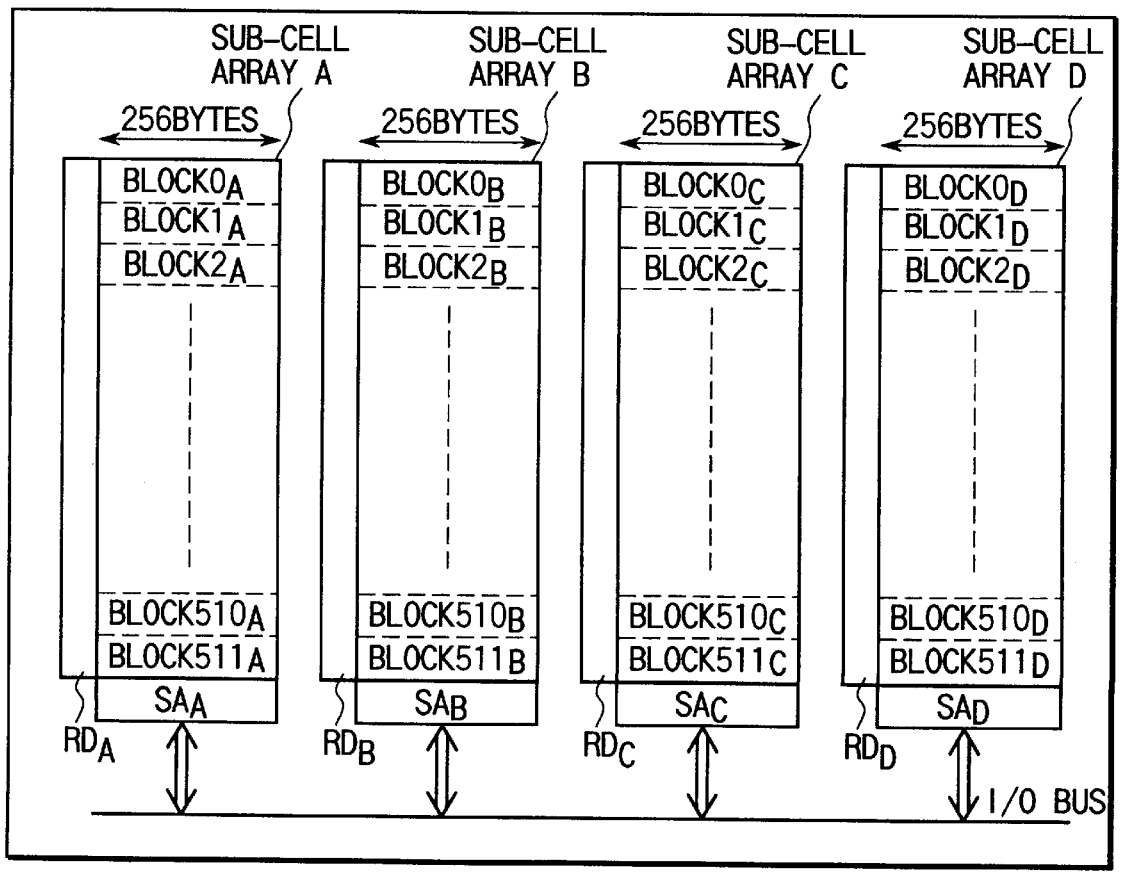
FIG. 5 is a block diagram depicting a structure of a memory cell array of a semiconductor memory device according to a first embodiment of the present invention.

FIG. 5 is a block diagram illustrating an example of a structure of a semiconductor device according to a first embodiment of the present invention. In the first embodiment, a memory cell array is divided into four sub-cell arrays A, B, C and D.

In FIG. 5, $SA_A$, $SA_B$, $SA_C$ and $SA_D$ indicate data circuits of the respective sub-cell arrays A to D. The data circuits input write data to a memory cell and hold data read out of a memory cell through a selected bit line in write and read operations. The bit line operates a data line transmitting and receiving data between the memory cell and the data circuit. Data can directly be written to/read out of a memory cell from external IO without such data circuits. $RD_A$, $RD_B$, $RD_C$ and $RD_D$ represent row decoders for selecting a control gate and a select gate.

Figure 6:
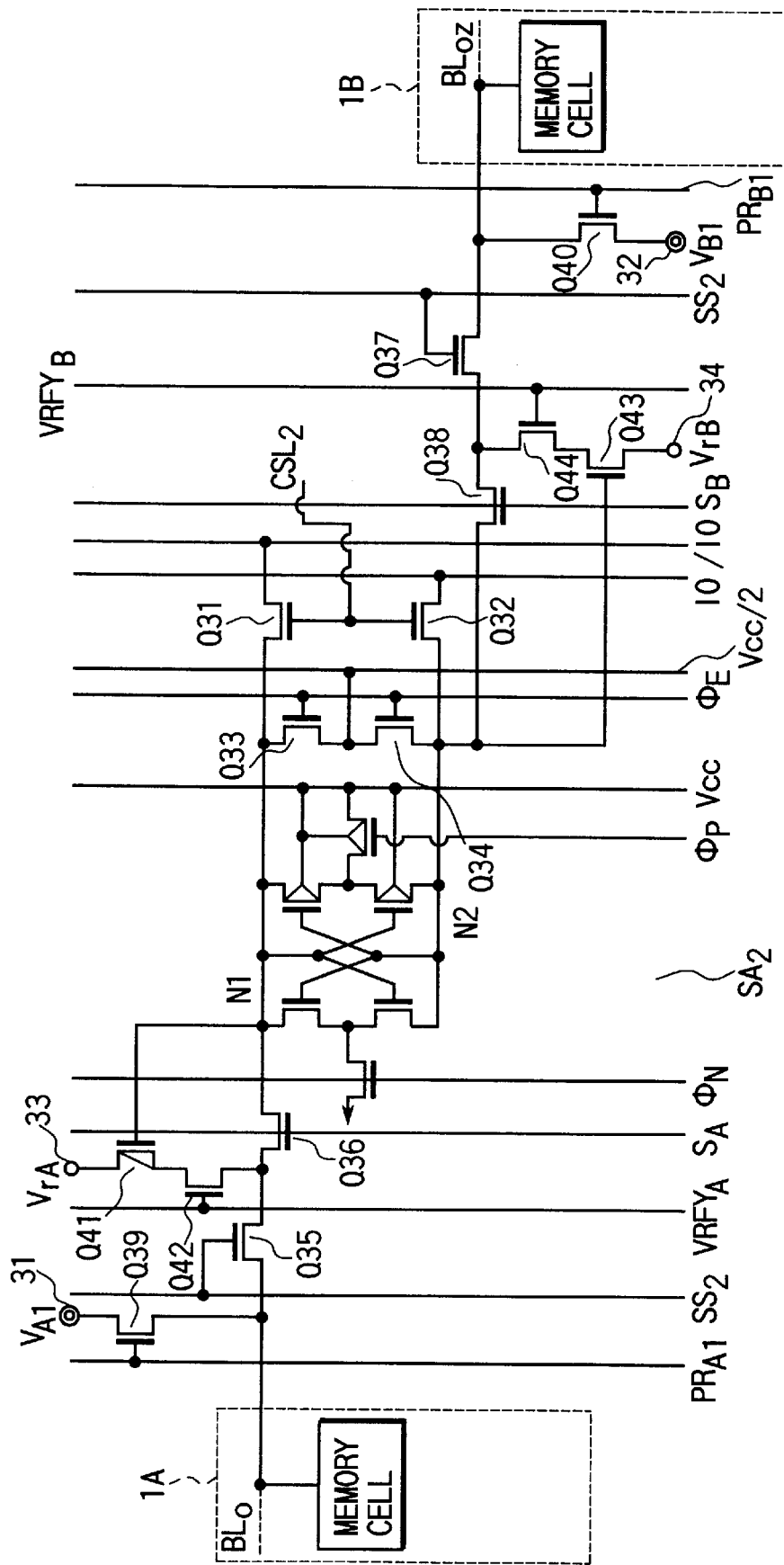
FIG. 6 is a circuit diagram showing an example of a data circuit of the memory cell array of FIG. 5.

FIG. 6 depicts a concrete example of the data circuit $SA_X$ (x=A, B, C, D) and more specifically a sense amplifier $SA_2$ (included in said data circuit $SA_X$) to which bit lines $BL_O$ and $BL_{OZ}$ are connected and its peripheral circuit. The sense amplifier $SA_2$ serves as a data latch circuit, too. The sense amplifier $SA_2$ is activated by sense amplifier activation signals $\Phi_N$ and $\Phi_P$.

A transistor Q31 is connected between a node N1 of the sense amplifier $SA_2$ and a data line/IO, while a transistor Q32 is connected between a node N2 thereof and a data line IO. These transistors Q31 and Q32 are controlled by a column select signal $CSL_2$ supplied from a column decoder.

Transistors Q33 and Q34, which are controlled by an equalize signal $\Phi_E$, are connected between the nodes N1 and N2 of the sense amplifier $SA_2$. A connecting point of the transistors Q33 and Q34 is supplied with a power supply voltage Vcc/2. When the transistors Q33 and Q34 are turned on in response to the equalize signal $\Phi_E$, the nodes N1 and N2 are equalized to Vcc/2.

A transistor Q35 controlled by a bit line select signal $SS_2$ and a transistor Q36 controlled by a sense amplifier select signal $S_A$, are connected between the bit line $BL_0$ and the node N1 of the sense amplifier $SA_2$. A transistor Q37 controlled by the bit line select signal $SS_2$ and a transistor Q38 controlled by a sense amplifier select signal $S_B$, are connected between the bit line $BL_{0Z}$ and the node N2 of the sense amplifier $SA_2$.

A transistor Q39 controlled by a precharge signal $PR_{A1}$ is connected between a connecting point of the transistors Q35 and Q36 and a power supply terminal 31. The transistor Q39 precharges the bit line $BL_0$ in response to the precharge signal $PR_{A1}$.

A transistor Q40 controlled by a precharge signal $PR_{B1}$ is connected between a connecting point of the transistors Q37 and Q38 and a power supply terminal 32. The terminal 32 is supplied with a precharge voltage $V_{B1}$. The transistor Q40 precharges the bit line $BL_{0Z}$ in response to the precharge signal $PR_{B1}$.

Transistors Q41 and Q42 are connected between the connecting point of the transistors Q35 and Q36 and a power supply terminal 33. The terminal 33 is supplied with a verify voltage $V_{rA}$. The gate of the transistor Q41 is connected to the node N1, and the gate of the transistor Q42 is supplied with a verify signal $VRFY_A$.

Transistors Q43 and Q44 are connected between the connecting point of the transistors Q37 and Q38 and a power supply terminal 34. The terminal 34 is supplied with a verify voltage $V_{rB}$. The gate of the transistor Q43 is connected to the node N2, and the gate of the transistor Q44 is supplied with a verify signal $VRFY_B$.

(Read Operation)

A read operation will now be described using a timing diagram.

Figure 7:
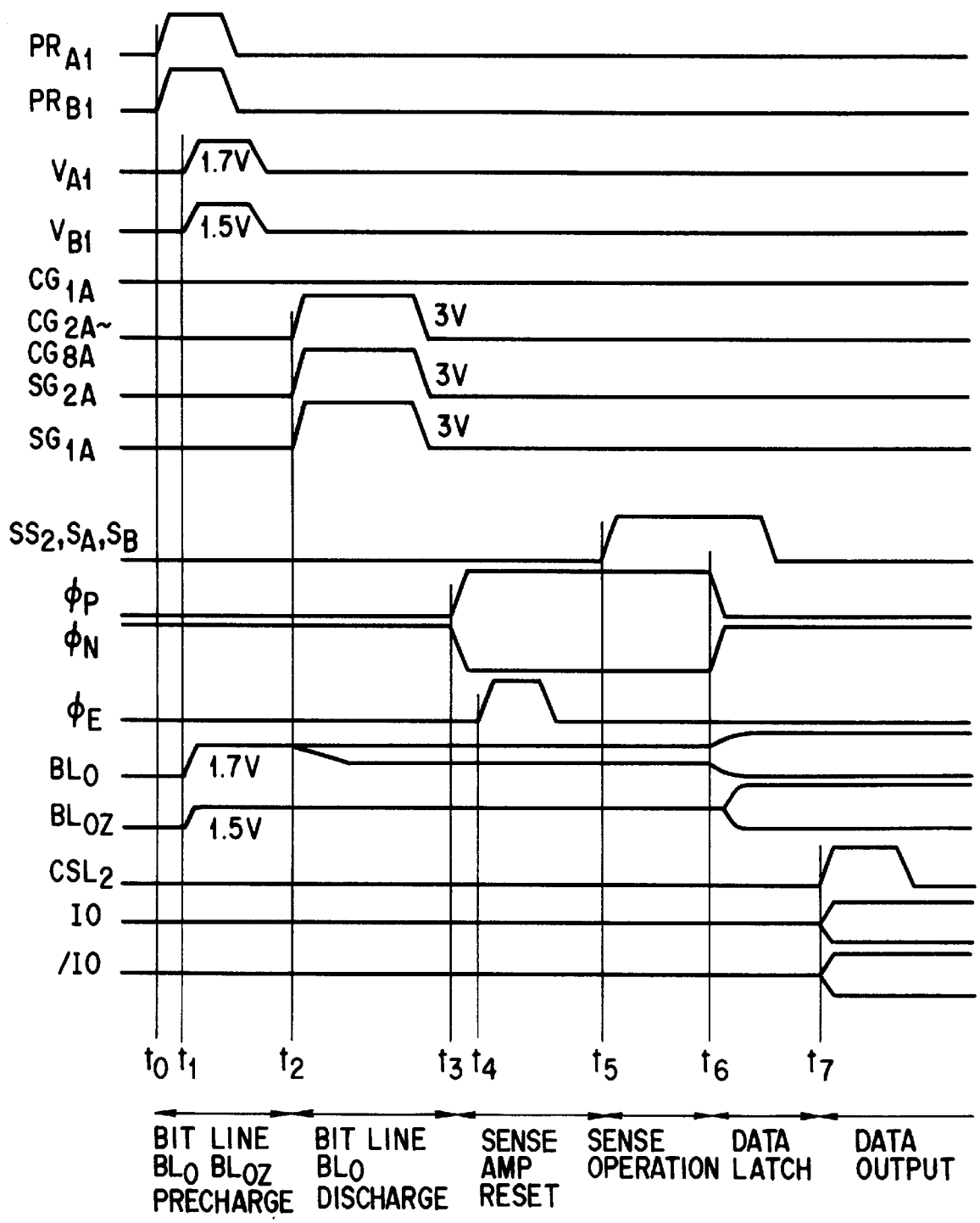
FIG. 7 is a timing diagram of a data readout operation.
Figure 10:
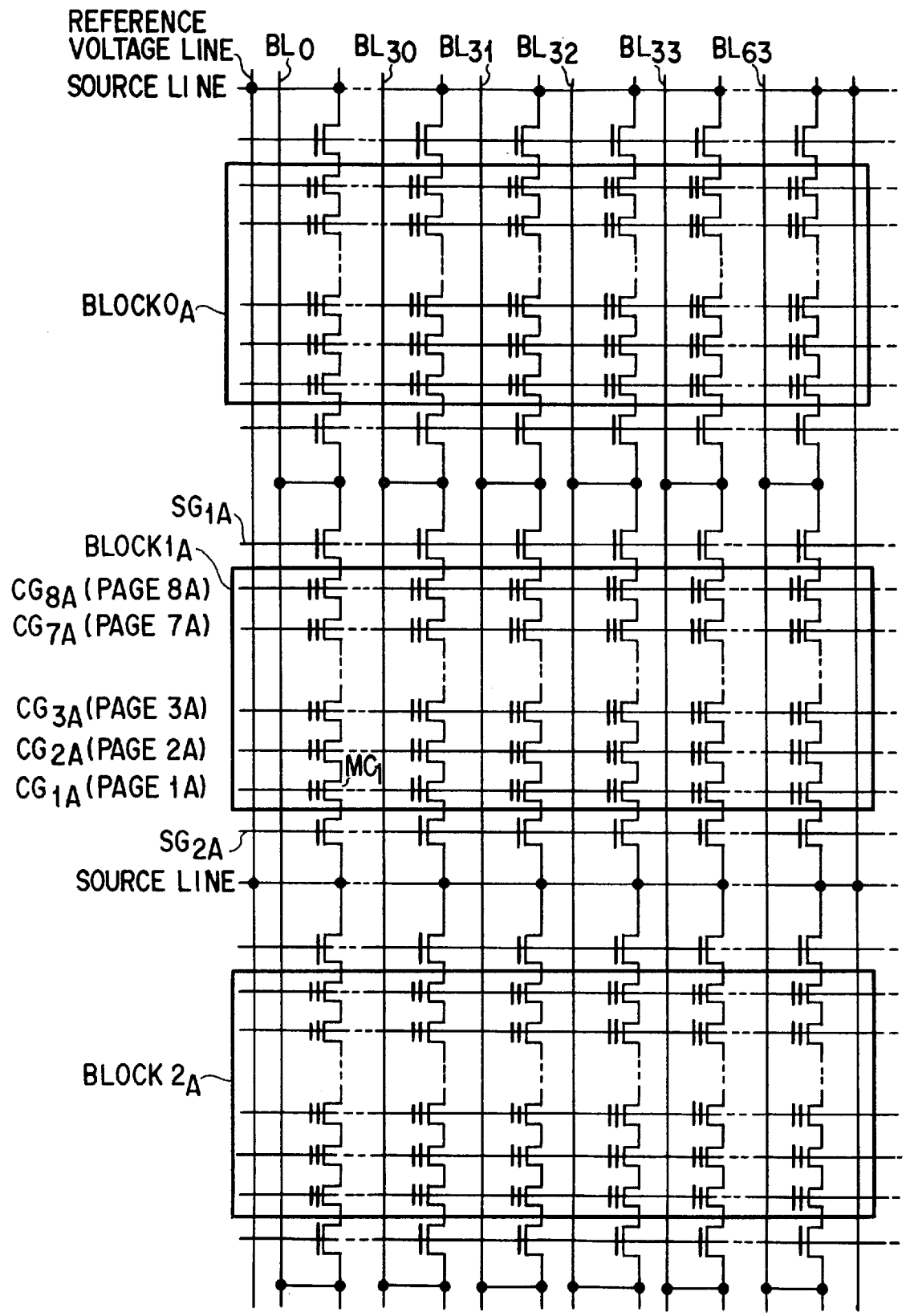
FIG. 10 is a circuit diagram of a sub-array A.

FIG. 7 is a diagram of timing at which data is read out of the memory cell $MC_1$ illustrated in FIG. 10. First, precharge signals $PR_{A1}$ and $PR_{B1}$ are each changed from $V_{SS}$ to $V_{CC}$ at time $t_0$, and a bit line $BL_0$ and a dummy bit line $BL_{0Z}$ are precharged to $V_{A1}$ (e.g., 1.7V) and $V_{B1}$ (e.g., 1.5V), respectively, at time $t_1$.

After they are precharged, the precharge signals $PR_{A1}$ and $PR_{B1}$ are set to $V_{SS}$ and the bit lines $BL_0$ and $BL_{0Z}$ go into a floating state. Then, a desired voltage is applied from a row decoder to each of the select gates and each of the control gates at time $t_2$. A voltage of 0V is applied to the control gate $CG_{1A}$ and $V_{CC}$ (e.g., 3V) is applied to each of the control gates $CG_{2A}$ to $CG_{8A}$, while a voltage of 3V is applied to the select gates $SG_{2A}$ and $SG_{1A}$.

If data written to the memory cell $MC_1$ is "0", the threshold voltage of the memory cell is positive; thus no cell current flows and the potential of the bit line $BL_0$ remains at 1.7V. If the data is "1", cell current flows and the potential of the bit line $BL_0$ decreases to 1.5V or less. The dummy bit line $BL_{0Z}$ remains at a precharge potential of 1.5V.

At time $t_3$, the sense amplifier activation signals $\Phi_P$ and $\Phi_N$ are set to 3V and 0V, respectively, and a CMOS flip-flop FF of the sense amplifier $SA_2$ is deactivated. The equalize signal $\Phi_E$ is set to 3V at time $t_4$, and thus the CMOS flip-flop FF is equalized and the nodes N1 and N2 are set to $V_{CC}/2$ (e.g., 1.5V). At time $t_5$, $SS_2$, $S_A$ and $S_B$ are set to 3V, and the bit line and sense amplifier are connected to each other. The signal $\Phi_N$ is changed from 0V to 3V and the signal $\Phi_P$ is changed from 3V to 0V, and the voltage difference between the bit lines $BL_0$ and $BL_{0Z}$ is amplified at time $t_6$.

In other words, if data "0" is written to the memory cell $MC_1$, the nodes N1 and N2 of the sense amplifier $SA_2$ are set to 3V and 0V, respectively and, if data "1" is written thereto, the nodes N1 and N2 are set to 0V and 3V, respectively. After that, if the voltage of the column select signal $CSL_2$ is changed from 0V to 3V, data latched in the CMOS flip-flop FF is supplied to the data lines IO and /IO at time $t_7$.

(Write Operation)

A write operation will now be described using a timing diagram.

Figure 8:
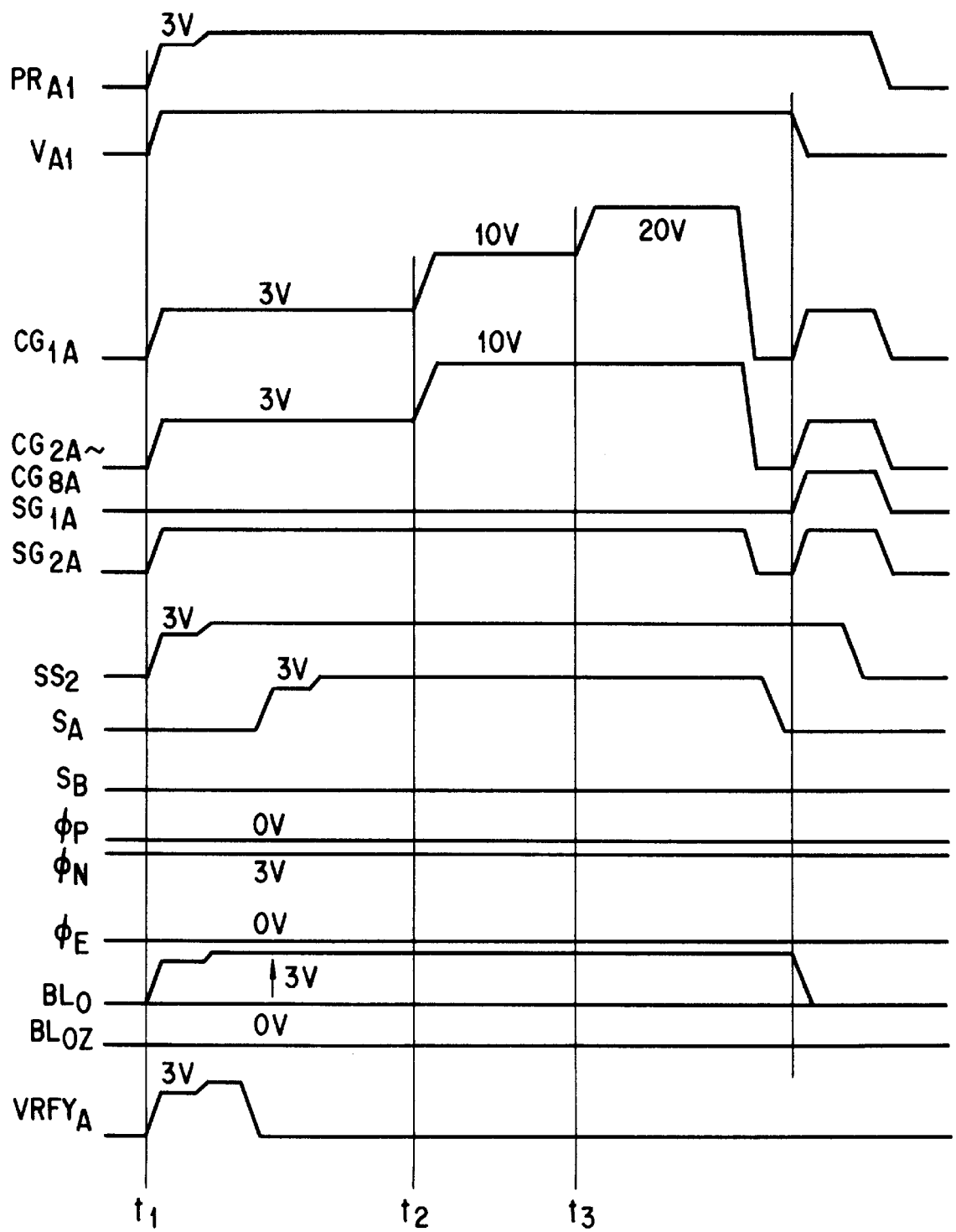
FIG. 8 is a timing diagram of a data write operation.

FIG. 8 is a diagram of timing at which data is written to the memory cell $MC_1$. The data to be written to the memory cell $MC_1$ is latched in the sense amplifier $SA_2$ (shown in FIG. 6). If data "0" is written, the nodes N1 and N2 are set to 0V and 3V, respectively and, if data "1" is written, the nodes N1 and N2 are set to 3V and 0V, respectively.

When a write operation starts, the select gate $SG_{1A}$ is set to $V_{SS}$ and the select gate $SG_{2A}$ and control gates $CG_{1A}$ to $CC_{8A}$ are set to $V_{CC}$ at time $t_1$. A voltage of $V_{CC}$ c,r $V_{SS}$ (0V) is applied to the bit line BLO in accordance with the data latched in the sense amplifier $SA_2$. If data "0" is written to the memory cell $MC_1$, the bit line $BL_0$ is set to 0V and so is the channel of the memory cell $MC_1$. If data "1" is written to the memory cell $MC_1$, the bit line $BL_0$ is set to $V_{CC}$ (e.g., 3V) and the channel of the memory cell $MC_1$ is charged to $V_{CC}-V_{th}$. A select MOS transistor having a select gate $SG_{1A}$ of 0V serving as a gate electrode, is turned off.

When data "0" is written to the memory cell $MC_1$, the channel of the memory cell remains at 0V. When data "1" is written, the channel of the memory cell goes into a floating state. At time $t_2$, the voltage of the control gates $CG_{1A}$ to $CG_{BA}$ is changed from $V_{CC}$ to the intermediate voltage $V_M$ (about 10V). Since, therefore, the channel of the memory cell $MC_1$ to which data "1" is written is in a floating state, the voltage is boosted from $V_{CC}-V_{th}$ to the intermediate voltage $V_M$ (about 10V) by the capacitive coupling between the control gates and the channel of the memory cell. The channel of the memory cell $MC_1$ to which data "0" is written is at 0V since the bit line is at 0V.

After the channel of the memory cell to which "1" is written is boosted from $V_{CC}-V_{th}$ to the intermediate voltage $V_M$, the control gate $CG_{1A}$ is boosted from the intermediate $V_M$ to a write voltage $V_{PP}$ (20V) at time $t_3$. Since the channel of the memory cell $MC_1$ to which data "1" is to be written is at the intermediate voltage (about 10V) and the control gate $CG_{1A}$ is at $V_{PP}$ (about 20V), the data "1" is not written to the memory cell. Since, however, the channel of the memory cell $MC_1$ to which data "0" is to be written is at 0V and the control gate $CG_{1A}$ is at $V_{PP}$ (about 20V), electrons are injected from the substrate into the floating gate and data "0" is written to the memory cell. The control gate, select gate and bit line are discharged in sequence, and the write operation is completed.

After the completion of the write operation, a verify operation is performed to check whether data is written sufficiently or not.

Figure 9:
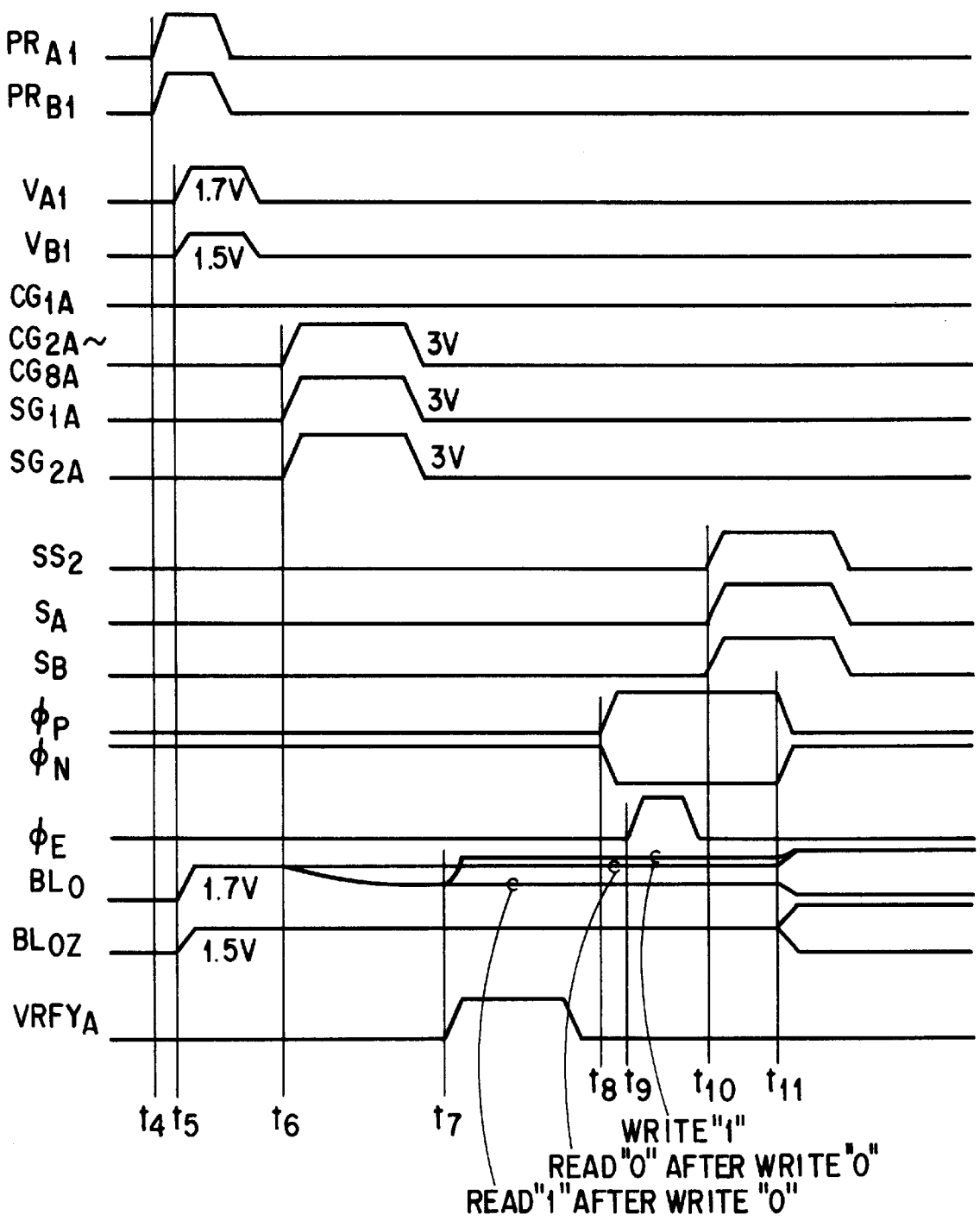
FIG. 9 is a timing diagram of a write verify operation.

FIG. 9 is a timing diagram of a write verify operation. First, precharge signals $PR_{A1}$ and $PR_{B1}$ are each changed from $V_{SS}$ to $V_{CC}$ at time t4, and a bit line $BL_0$ and a dummy bit line $BL_{0Z}$ are precharged to $V_{A1}$ (e.g., 1.7V) and $V_{B1}$ (e.g., 1.5V), respectively, at time t5.

After they are precharged, the precharge signals $PR_{A1}$ and $PR_{B1}$ are set to $V_{SS}$ and the bit lines $BL_0$ and $BL_{0Z}$ goes into a floating state. Then, a desired voltage is applied from a row decoder to each of the select gates and each of the control gates at time $t_6$. A voltage of 0V is applied to the control gate $CG_{1A}$ and $V_{CC}$ (e.g., 3V) is applied to each of the control gates $CG_{2A}$ to $CG_{8A}$, while a voltage of 3V is applied to the select gates $SG_{2A}$ and $SG_{1A}$. If data written to the memory cell $MC_1$ is "0," the threshold voltage of the memory cell is positive; therefore no cell current flows and the potential of the bit line $BL_0$ remains at 1.7V. If the data is "1," cell current flows and the potential of the bit line $BL_0$ decreases to 1.5V or less.

After the bit lines are discharged, a verify signal $VRFY_A$ is set to 3V at time $t_7$. If data written to the memory cell $MC_1$ is "1," the bit line $BL_0$ is charged to approximately 3V. The level of the charge executed by the verify signal has only to be not lower than the precharge voltage (1.5V) of the dummy bit line $BL_{0Z}$. Meanwhile the dummy bit line $BL_{0Z}$ remains at the precharge voltage of 1.5V.

At time $t_8$, the sense amplifier activation signals $\Phi_P$ and $\Phi_N$ are set to 3V and 0V, respectively, and the CMOS flip-flop FF of the sense amplifier $SA_2$ is deactivated. The equalize signal $\Phi_E$ is set to 3V at time $t_9$, and thus the CMOS flip-flop FF is equalized and the nodes N1 and N2 are set to $V_{CC}/2$ (e.g., 1.5V). At time $t_{10}$, $SS_2$, $S_A$ and $S_B$ are set to 3V, and the bit line and sense amplifier are connected to each other. The signal $\Phi_N$ is changed from 0V to 3V and the signal $\Phi_P$ is changed from 3V to 0V, and the voltage difference between the bit lines $BL_0$ and $BL_{0Z}$ is amplified, and rewrite data is latched in the sense amplifier at time $t_{11}$.

FIG. 10 is a circuit diagram of the sub-cell array A. The word lines of each of blocks constituting the sub-cell array A are denoted by $CG_{1A}$ to $CG_{8A}$. In FIG. 10, the reference numerals $CG_{1A}$ to $CG_{8A}$ are assigned to only the word line of block 1A for the sake of convenience. A group of memory cells having control gates connected to the respective word lines, corresponds to one page, and 1A to 8A are assigned to such pages to be consistent with the reference numerals of the word lines.

The sub-cell array A includes of blocks 0A, 1A, 2A, . . . each having 8 pages. The circuit arrangement of each of the sub-cell arrays B, C and D corresponds to that of the sub-cell array A shown in FIG. 10.

The sub-cell arrays of FIG. 5 are each 256 bytes, i.e., 256×8 columns and, in other words, the number of bit lines per one sub-cell array is 256×8. In the first embodiment, the number of memory cell pages selected at once in the write and read operations is variable.

For example, when memory cell page $1_A$ included in the sub-cell array A is selected, the page size in the read and write operations is 256 bytes. When memory cell pages $1_A$ and $1_B$ included in the sub-cell arrays A and B are selected at once and memory cell pages $1_C$ and $1_D$ included in the sub-cell arrays C and D are selected at once, the page size in the read and write operations is 512 bytes.

If, furthermore, the memory cell pages $1_A$, $1_B$ and $1_C$ included in the sub-cell arrays A, B and C are selected simultaneously, the page size can be 768 bytes. If the memory cell pages $1_A$, $1_B$, $1_C$ and $1_D$ included in the sub-cell arrays A, B, C and D are selected simultaneously, the page size can be 1024 bytes.

When two sub-cell arrays are activated at once in the write and read operations, an erase operation can be performed for each of the sub-cell arrays or for both of them at once.

If memory cell pages of a plurality of sub-cell arrays are selected simultaneously in the write and read operations, the number of memory cell pages can be varied. It is the feature of the present invention that the memory cell pages selected simultaneously have their respectively different word lines, and these memory cell pages can be set by the word lines.

Figure 11:
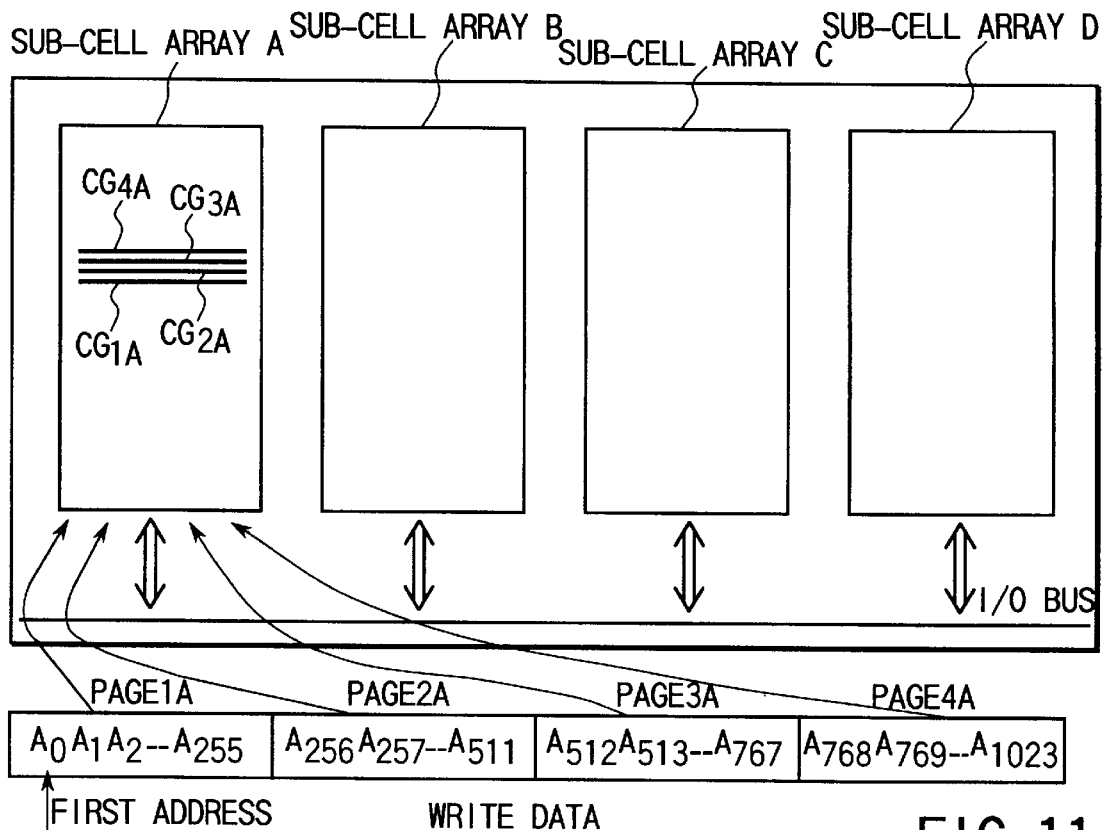
FIG. 11 is a view of a write operation performed when the page size is 256 bytes.
Figure 12:
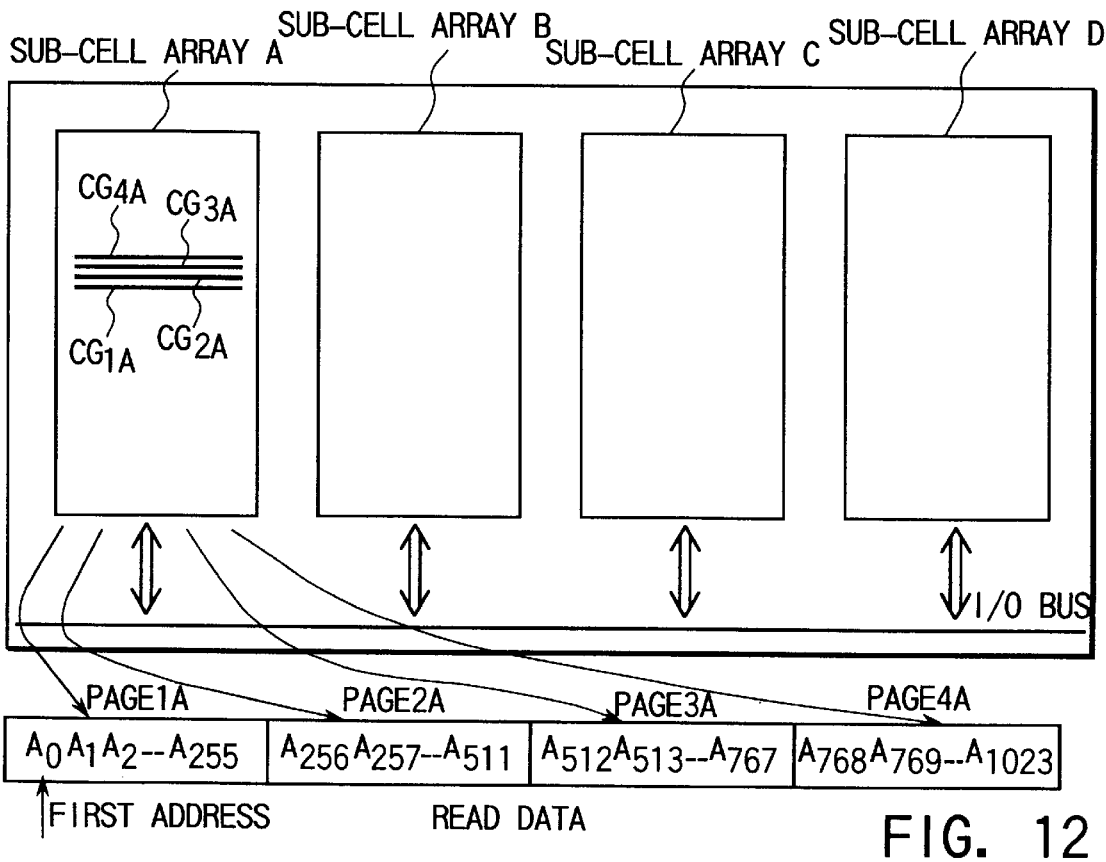
FIG. 12 is a view of a read operation performed when the page size is 256 bytes.
Figure 13:
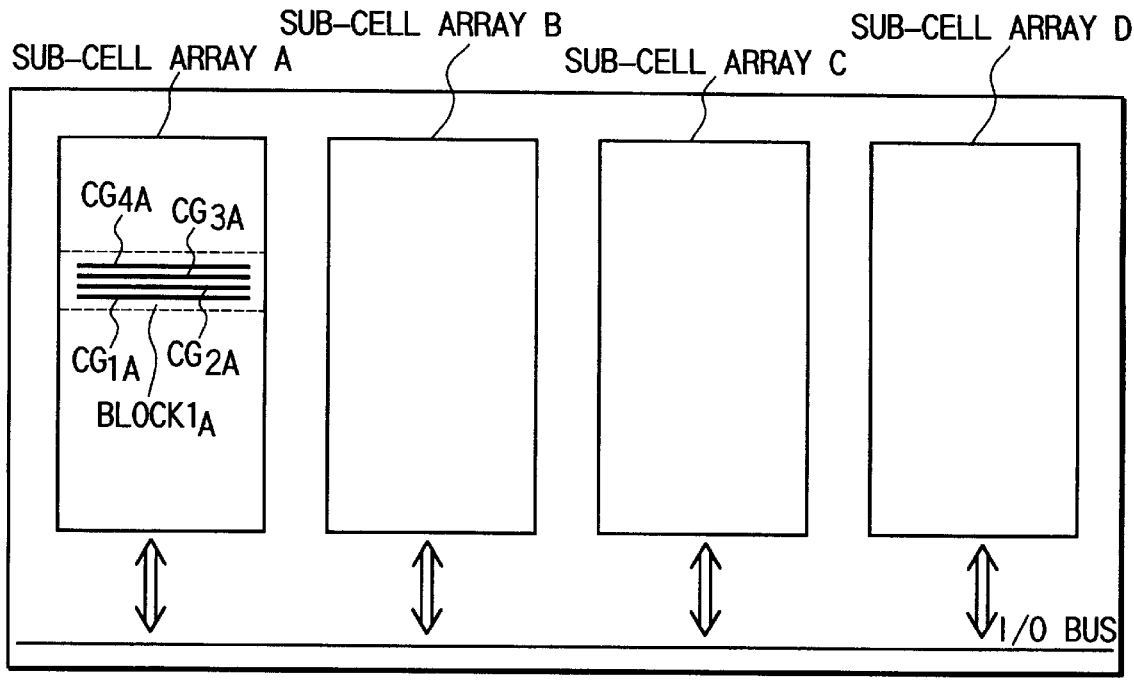
FIG. 13 is a view of an erase operation performed when the page size is 256 bytes.

The process of write, read and erase operations in the first embodiment will now be described in more detail. The write, read and erase operations performed when the page size is 256 bytes as shown in FIG. 5, are illustrated in FIGS. 11, 12 and 13, respectively. In FIGS. 11 and 12, $A_0, A_1, \ldots, A_{255}$ each indicate 1-byte data.

The first embodiment has eight data input and output lines as an I/O bus through which data is input/output to/from the outside of a chip. FIG. 11 shows only one data input/output line as the I/O bus for simplification.

The write operation is carried out as illustrated in FIGS. 10 and 11. If data of 256 bytes ($A_0, A_1, \ldots, A254, A255$) from the first address is written to memory cells (page 1A) selected by the control gate $CG_{1A}$ of, e.g., the sub-cell array A, the next 256-byte data is written to memory cells (page 2A) selected by the control gate $CG_{2A}$, the next 256-byte data is written to memory cells (page 3A) selected by the control gate $CG_{3A}$ and the next 256-byte data is written to memory cells (page 4A) selected by the control gate $CG_{4A}$. Thus, data is written to the memory cells of the sub-cell array A as indicated by the arrows of FIG. 11.

The read operation is performed as illustrated in FIGS. 10 and 12. If data is read out of memory cells (page 1A) selected by the control gate $CG_{1A}$ in the sub-cell array A of FIG. 10, then the data is read out of memory cells (page 2A) selected by the control gate $CG_{2A}$, the next data is read out of memory cells (page 3A) selected by the control gate $CG_{3A}$, and the next data is read out of memory cells (page 4A) selected by the control gate $CG_{4A}$. Thus, data is read out of the memory cells of the sub-cell array A as indicated by the arrows of FIG. 12.

The write and read operations can be performed directly or through a data circuit $SA_A$ of the sub-cell array A. The erase operation can be carried out for each of the blocks of each sub-cell array as indicated by the broken line in FIG. 13, or it can be done for blocks of a plurality of sub-cell arrays at once.

Figure 14:
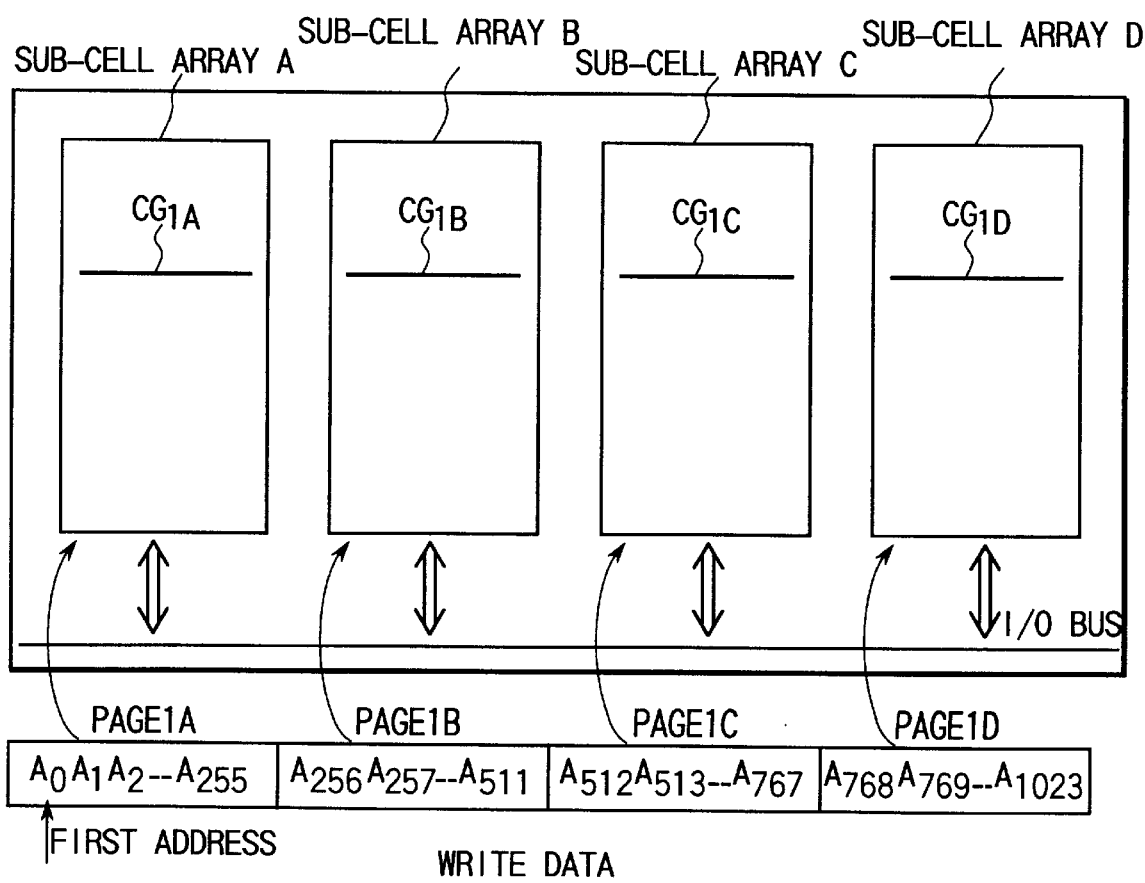
FIG. 14 is a view of a write operation performed when the page size is 1024 bytes.
Figure 15:
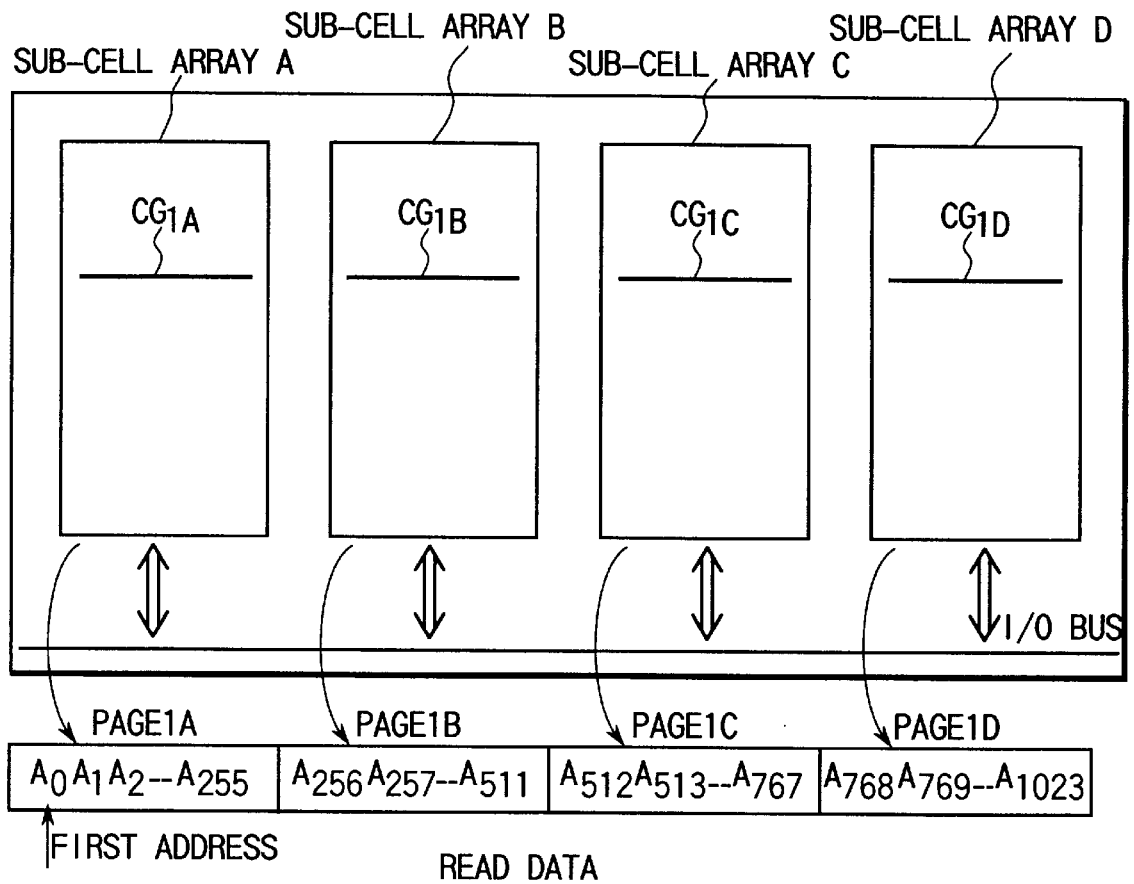
FIG. 15 is a view of a read operation performed when the page size is 1024 bytes.
Figure 16:
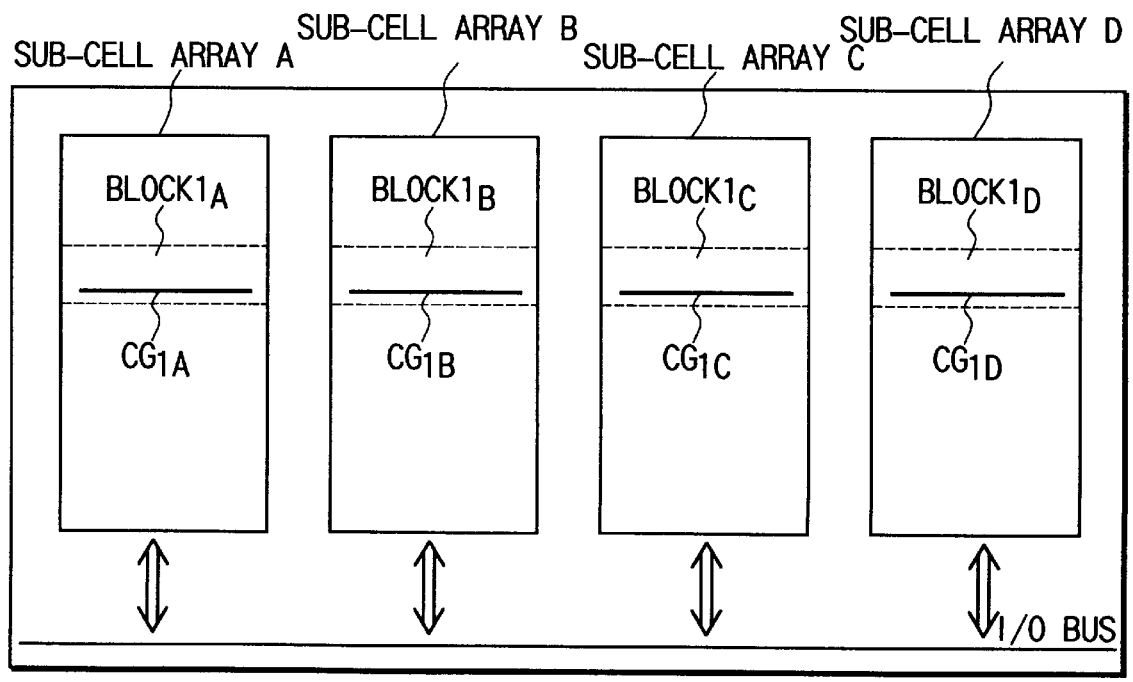
FIG. 16 is a view of an erase operation performed when the page size is 1024 bytes.

The process of write, read and erase operations performed when the page size is 1024 bytes are illustrated in FIGS. 14, 15 and 16, respectively. In FIGS. 14 and 15, $A_0, A_1, \ldots, A_{1023}$ each indicate 1-byte data. The number of data input/output lines (I/O bus) connected to the outside of a chip is eight. When the page size is 1024 bytes, the sub-cell arrays A, B, C and D are selected at the same time.

The write operation is performed as shown in FIG. 14. Data of 256 bytes ($A_0, A_1, \ldots, A_{255}$) from the first address is stored in the data circuit $SA_A$ (FIG. 5) in the sub-cell array A, the next 256-byte data is stored in the data circuit $SA_B$, the next 256-byte data is stored in the data circuit $SA_C$, and the next 256-byte data is stored in the data circuit $SA_D$. Based on the data of the data circuits, data are written to memory cells (page 1A) selected by the control gate $CG_{1A}$, those (page 1B) selected by the control gate $CG_{1B}$, those (page 1C) selected by the control gate $CG_{1C}$, and those (page 1D) selected by the control gate $CG_{1D}$ at the same time. The speed of the write operation is therefore about four times greater than the case where the page size is 256 bytes.

Figure 17A:
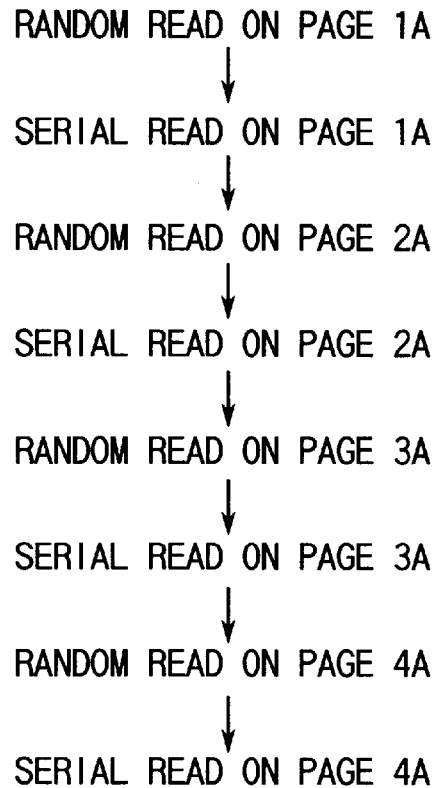
FIG. 17A is a view for explaining the read operation performed when the page size is 256 bytes.
Figure 17B:
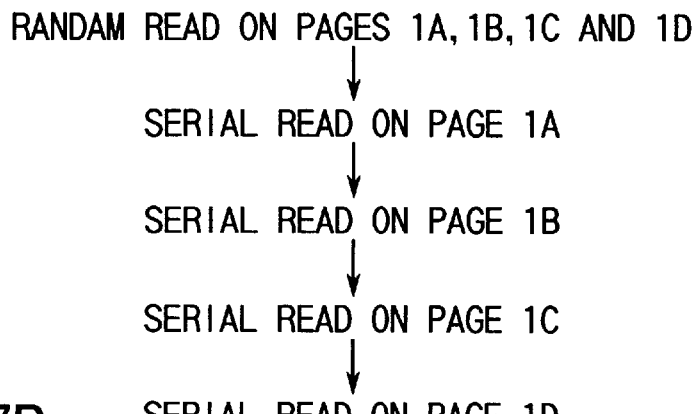
FIG. 17B is a view for explaining the read operation performed when the page size is 1024 bytes.

The read operation will be described with reference to FIGS. 15, 17A and 17B. When the page size is 256 bytes as shown in FIG. 17A, a random read is always required before a serial read of data of each page. Thus, four random read operations and four serial read operations are necessary when 1024-byte data is read out.

When the page size is 1024 bytes, the control gates $CG_{1A}$, $CG_{1B}$, $CG_{1C}$ and $CG_{1D}$ are selected at the same time and thus only one random read operation has to be performed. In other words, after one random read operation is carried out, data of pages 1A, 1B, 1C and 1D can be output continuously.

In the read operation, too, the larger the page size, the higher the readout speed. The write and read operations for the pages 1A, 1B, 1C and 1D can directly be performed at once but not through a data circuit.

Referring to FIG. 16, the erase operation will now be described. To erase data of 1024 bytes, data of pages 1A, 1B, 1C and 1D are erased at once. Since data of blocks 1A, 1B, 1C and 1D are erased at once, the number of memory cells to be erased at once is four times as large as that in the case where the page size is 256 bytes.

The write and read operations in both cases where the page size is 256 bytes and 1024 bytes, have been described. The number of sub-cell arrays to be activated at once can be two, and the page size can be doubled; otherwise, the number of sub-cell arrays to be activated at once can be three and the page size can be increased three times.

If, as shown in FIG. 11, all the 1024-byte data is written to the block 1A included in the sub-cell array A, the block 1A has only to be erased and the erase unit can be reduced to 256 bytes ×8 ($CG_{1A}$ to $CG_{8A}$). If the page size is reduced to 256 bytes, the number of memory cells to be erased at once can be decreased.

If the page size is increased, the speed of the write and read operations is increased, whereas data has to be erased from a large number of memory cells. In memory data with a small capacity (e.g., 256 bytes or less), it is advisable to reduce the erase unit by decreasing the page size. In memory data with a large capacity (e.g., 10 kilobytes), it is advantageous to perform the write and read operations at high speed by increasing the page size.

A control system for varying the page size for write and read operations will now be described as a second embodiment of the present invention.

If page 1A of sub-cell array A shown in FIG. 5 is selected in the first mode, pages 1A and 1B of sub-cell arrays A and B are selected in the second mode, pages 1A, 1B and 1C of sub-cell arrays A, B and C are selected in the third mode, and pages 1A, 1B, 1C and 1D of sub-cell arrays A, B, C and D are selected in the fourth mode, 256-byte data, 512-byte data, 768-byte data and 1024-byte data can be written or read out simultaneously by selecting the first to fourth modes.

The page size can be controlled by a command from outside a flash memory. If it can be done, a user of the flash memory is able to freely change the page size according to use.

Figure 18:
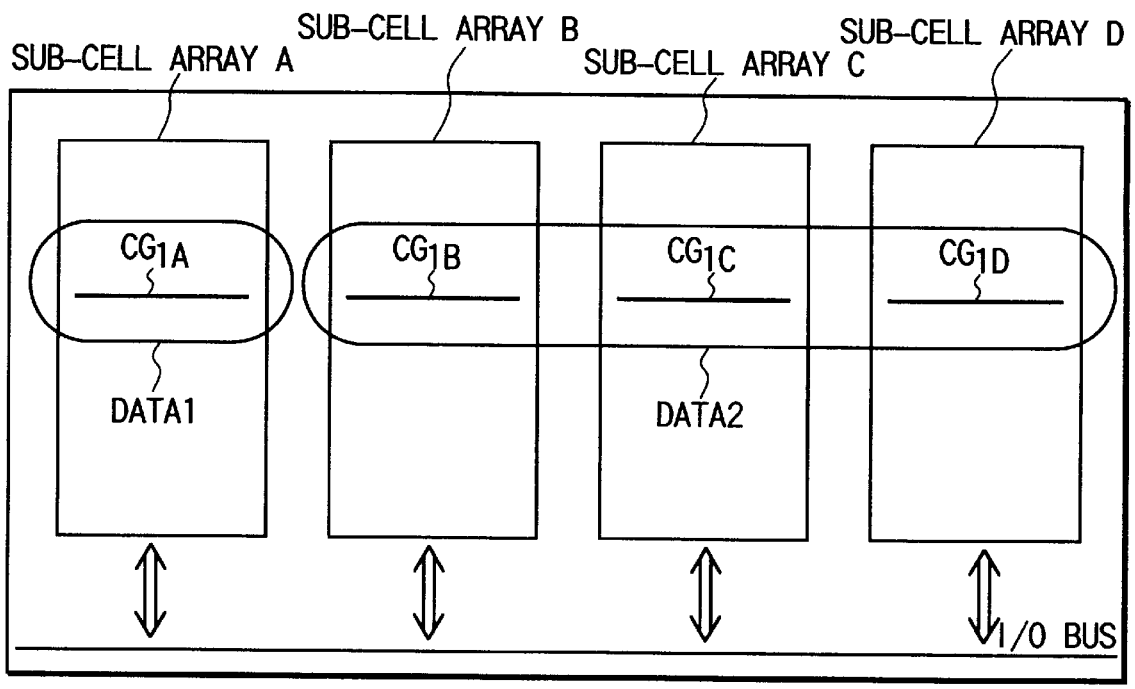
FIG. 18 is a view showing an example of data structure of the present invention.

A plurality of pages of different sizes can be included simultaneously in a memory cell array of one chip. If, as shown in FIG. 18, write data is 256 bytes or less (data 1), it is written to the page 1A ($CG_{1A}$) with the page size of 256 bytes. If write data is 768 bytes (data 2), it is written to the page 1B ($CG_{1B}$), page 1C ($CG_{1C}$) and page 1D ($CG_{1D}$) with the page size of 768 bytes.

Figure 19:
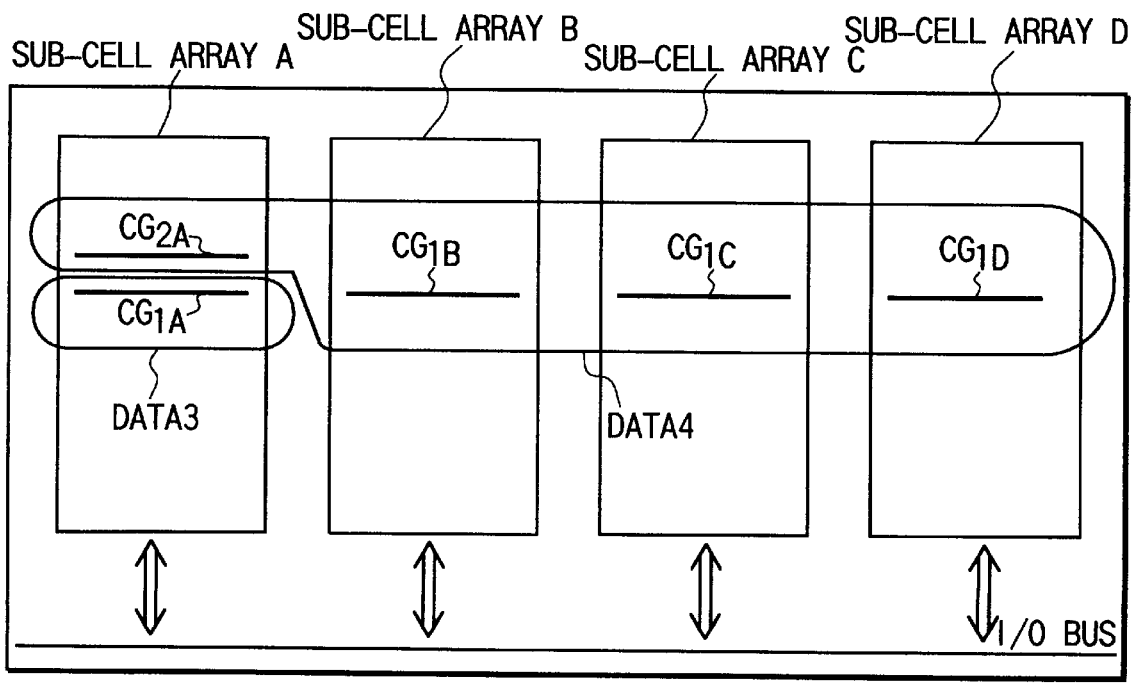
FIG. 19 is a view showing another example of data structure of the present invention.

Furthermore, as illustrated in FIG. 19, 1024-byte data (data 4) can be written to the page 1B ($CG_{1B}$), page 1C ($CG_{1C}$), page 1D ($CG_{1D}$) and page 2A ($CG_{2A}$ in FIG. 10) with the page size of 1024 bytes after data of 256 bytes or less (data 3) is written to the page 1A ($CG_{1A}$) with the page size of 256 bytes.

There are different methods of varying the page size and writing data. The page size can be fixed at the time of shipping of chips. To vary the page size, the method for setting an address has only to be changed. The address can easily be changed by cutting a fuse provided in part of an address decoder circuit of a chip or changing a pattern of metallization of aluminum or the like.

When the page size s varied, it is preferable that the number of memory cell pages selected simultaneously is set to be the same during read and write operations. Even though a plurality of chips are designed in the same manner, different page sizes such as 256 bytes, 512 bytes, 768 bytes and 1024 bytes can be obtained by cutting fuses in the chips or changing patterns of metallization before shipping. Since the designs of the chips are the same irrespective of the page size, their costs can be reduced more greatly than those of chips of different page sizes but different designs.

A high-speed write operation of writing data to a sub-cell array through a data circuit, will be described as a third embodiment of the present invention. In the write operation, as soon as write data is input to a data circuit of one sub-cell array, data can be written to the sub-cell array.

In order to write data as shown in FIG. 14, data to be written to the page 1A is first input to the data circuit $SA_A$ of the sub-cell array A of FIG. 5 and then data to be written to the page 1B is input to the data circuit $SA_B$ of the sub-cell array B. During the input of the latter data to the data circuit $SA_B$, the former data can start to be written to the page 1A from the data circuit $SA_A$.

After the input of the data to the data circuit $SA_B$ is completed, the data can be written to the page 1B at the same time when data to be written to the page 1C is input to the data circuit $SA_C$ of the sub-cell array C.

If the input of the data to the data circuit $SA_C$ is completed, the data can be written to the page 1C at the same time when data to be written to the page 1D is input to the data circuit $SA_D$ of the sub-cell array D. If the input of data to a page of a sub-cell array, e.g., the page 1A of the sub-cell array A is completed when the input of the data to the data circuit $SA_D$ is completed, write data can be input to the data circuit $SA_A$ of the sub-cell array A and data can be written to the next page (page 2A) of the sub-cell array A.

As described above, a write operation is performed in a column of a data circuit to which write data has been written during the input of write data to another data circuit. The write operation can thus be performed at high speed.

A fourth embodiment of the present invention will be described with reference to FIG. 20.

The change of page size, as described above, can easily be performed by varying the address. The circuit arrangement of an address select circuit will now be described. The memory cell array of the fourth embodiment has the same arrangement as that of FIG. 5, and is divided into four sub-cell arrays. The column addresses and row addresses (page addresses) in the sub-cell array A are shown in FIG. 20.

The column addresses for selecting bit lines include column addresses $C_0$ to $C_{255}$ in sub-cell array A, column addresses $C_{256}$ to $C_{511}$ in sub-cell array B, column addresses $C_{512}$ to $C_{767}$ in sub-cell array C and column addresses $C_{768}$ to $C_{1023}$ in the sub-cell array D. The page addresses (row addresses) of the sub-cell arrays B, C and D correspond to those of the sub-cell array A if the suffix A of $P_A$ to $P_{8191A}$ is replaced by B, C and D, respectively, in FIG. 20. Since there are eight input/output (I/O) lines ($I/O_0$ to $I/O_7$), eight columns (eight bit lines) corresponding to each of the I/O lines are selected simultaneously by one column address.

Since a column address of different columns (bit lines) is assigned to each of the I/O lines, an arbitrary column can be selected. If, therefore, the page size is 256 bytes, a write operation has only to be performed after write data is sequentially input to the data circuit of column addresses $C_{256}$ to $C_{511}$ of the sub-cell array B. If the page size is 1024 bytes, a write operation has only to be performed after write data is sequentially input to the data circuit of column addresses $C_{10}$ to $C_{1024}$.

The input of the write data has only to be performed contrary to serial read. The column addresses are selected in sequence by a counter or the like, and the write data is input to the data circuit from outside a chip. The operation of inputting the write data in serial order is described in detail in Y. Iwata et al., IEEE J. Solid-State Circuits, Vol. 30, No. 11, P. 1157, Nov. 1995.

Figure 20:
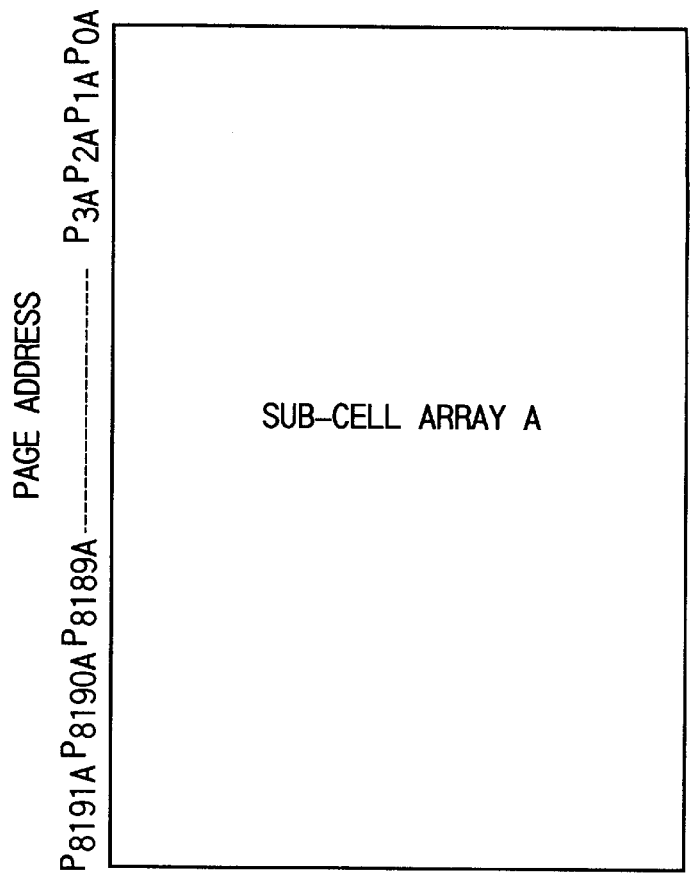
FIG. 20 is a view showing addresses of sub-cell array A of the present invention.

Each of the sub-cell arrays includes of 512 blocks, and each of the blocks includes 16 pages (16 control gates) The row addresses (page addresses) in FIG. 20 designate control gates in each of the sub-cell arrays. The sub-cell array A includes row addresses $P_{0A}$ to $P_{8191A}$, the sub-cell array B includes row addresses $P_{0B}$ to $P_{8191B}$, the sub-cell array C includes row addresses $P_{0C}$ to $P_{8191C}$, and the sub-cell array D includes $P_{0D}$ to $P_{8191D}$.

When the page size is 256 bytes, the row address $P_{4000C}$ for example of the sub-cell array C is selected. When the page size is 512 bytes, the row address $P_{5000A}$ of the sub-cell array A and the row address $P_{5000B}$ of the sub-cell array B are selected. When the page size is 1024 bytes, the row addresses $P_{2000A}$, $P_{2000B}$, $P_{2000C}$ and $P_{2000D}$ of the sub-cell arrays A, B, C and D are selected.

Figure 21:
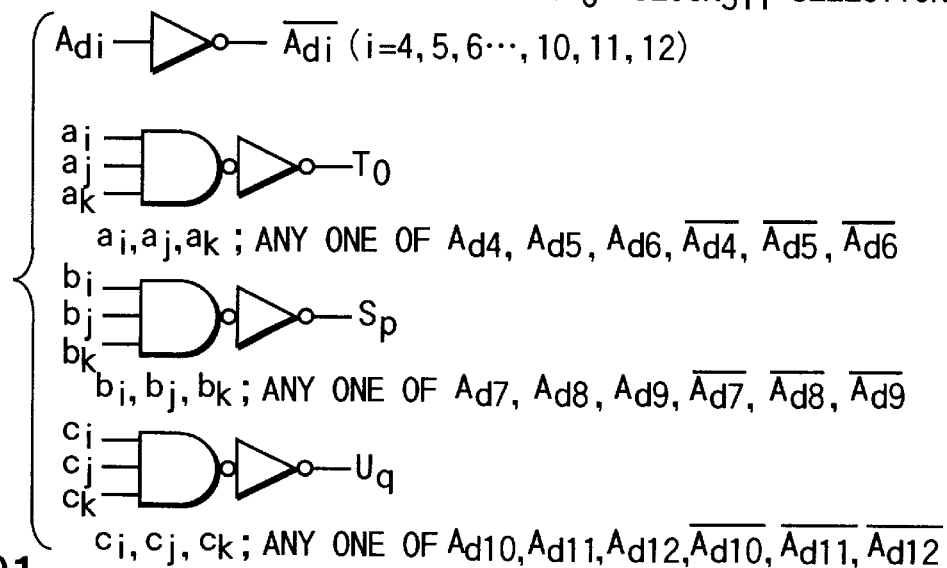
FIG. 21 is a view of an example of a row predecoder.
Figure 22:
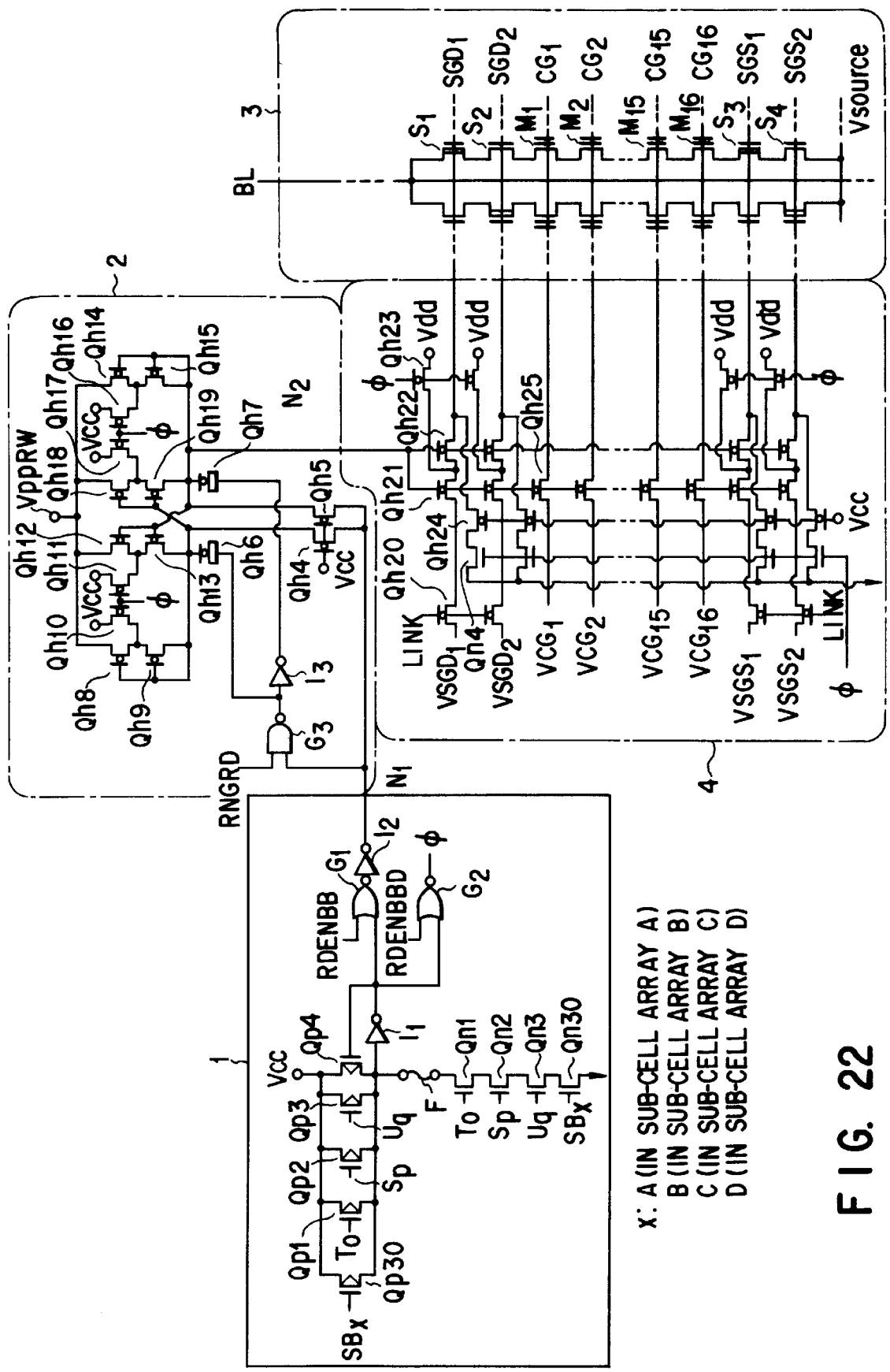
FIG. 22 is a view of an example of a row decoder of the present invention.

FIGS. 21 and 22 each illustrate an example of a row (page) select circuit for selecting a select gate and a control gate. FIG. 21 shows a row predecoder, while FIG. 22 shows a row decoder including block select and control circuits. In the row decoder of FIG. 22, memory cells of two columns per bit are connected (see Jpn. Pat. Appln. KOKAI Publication No. 8-63988). The row select circuit is similar irrespective of the arrangement of memory cell array and the kind of memory cells. Only the circuit arrangement other than that of the foregoing publication will now be described in detail.

As illustrated in FIG. 21, the row addresses of each of the sub-cell arrays are selected by external addresses $A_{d0}$ to $A_{d12}$. In other words, row addresses $P_{nx}$ (n=0, 1, 2, . . . , 8189, 8190, 8191; x=A, B, C, D) are selected using external addresses $A_{d0}$ to $A_{d12}$. Any one of common control gates $CG_1$ to $CG_{16}$ of NAND cells in each block is selected by the external addresses $A_{d0}$, $A_{d1}$, $A_{d2}$ and $A_{d3}$. The blocks 0 to 511 in each sub-cell array are selected using external addresses $A_{d4}$ to $A_{d12}$. In the row predecoder shown in FIG. 21, block select signals $T_o$, $S_p$ and $U_q$ are selected by the input external address.

The circuits shown in FIG. 22 comprise a block address decoder 1, a transfer gate bias circuit 2 for applying a desired voltage to the gates of transfer gates (e.g., Qh21, Qh22, Qh25), a block 3 having NAND cells, and a transfer gate circuit 4 for transferring control gate voltages $VCG_1$ to $VCG_{16}$ and select gate voltages $VSGD_1$, $VSGD_2$, $VSGS_1$ and $VSGS_2$ to control gates $CG_1$ to $CG_{16}$ and select gates $SGD_1$, $SGD_2$, $SGS_1$ and $SGS_2$, respectively.

The block address decoder 1 includes p-channel transistors Qp1 to Qp4 and Qp30, n-channel transistors Qn1 to Qn3 and Qn30, a fuse F, inverters $I_1$ and $I_2$, and NOR gates $G_1$ and $G_2$. Each of sub-cell arrays A to D is selected by a sub-cell array select signal $SB_X$ (X=A, B, C or D) and p-channel transistor Qp30 and n-channel transistor Qn30. The sub-cell array select signals $SB_A$, $SB_B$, $SB_C$ and $SB_D$ are input to the block address decoders of the sub-cell arrays A to D. In the sub-cell array whose sub-cell array select signal $SB_X$ is of low level, the output $N_1$ of the block address decoder becomes low when a block select signal RDENBB is at a low level irrespective of block select signals $T_o$, $S_p$ and $U_q$; thus, the sub-cell array goes into an unselected state.

If a subdecoder activation inverted signal RDENBBD is low in level, a signal $\Phi$ becomes high. As a result, the select gates SGD1, SGD2, SGS1 and SGS2 are each at 0V, and the sub-cell array is in an unselected state in write and read operations.

The sub-cell array whose sub-cell array select signal $SB_X$ is of high level, is in a selected state, and a block is selected by the block select signals $T_o$, $S_p$ and $U_q$ in the sub-cell array. If the fuse F blows or if one of the block select signals $T_o$, $S_p$ and $U_q$ is low, when the block select signal RDENBB is low, the output $N_1$ of the block address decoder becomes low in level and thus the block is in an unselected state.

On the other hand, if the fuse F does not blow and the block select signals $T_o$, $S_p$ and $U_q$ are all at a high level, the output $N_1$ of the block address decoder becomes high and thus the block is selected.

Since, in FIG. 22, one bit line is shared with memory cells of two columns, the block 3 includes four select gates $SGD_1$, $SGD_2$, $SGS_1$ and $SGS_2$. The method of selecting a block by a block address decoder is true of the sub-cell array having one bit line per memory cell of one column as shown in FIG. 10.

If $SB_A$ is set high and $SB_B$, $SB_C$ and $SB_D$ are set low when the page size is 256 bytes, only the sub-cell array A is selected. When the page size is 1024 bytes, the same pages (e.g., $P_{1000A}$, $P_{1000B}$, $P_{1000C}$, $P_{1000D}$) of the same blocks in all the sub-cell arrays are selected if $SB_A$, $SB_B$, $SB_C$ and $SB_D$ are all set high.

According to the foregoing fourth embodiment, when a plurality of sub-cell arrays are selected at the same time, not only the same pages of the same blocks are selected, but also different pages can be selected and, in other words, pages $P_{1000A}$, $P_{1500B}$, $P_{1800C}$ and $P_{2000D}$ can be selected simultaneously. Also, as illustrated in FIG. 19, pages $P_{100B}$, $P_{1001C}$, $P_{1001D}$ and $P_{1000A}$ can be selected.

As described above, the blocks to be selected at the same time are combined very optionally. For example, blocks 0 and 1 of the sub-cell array A, block 100 of the sub-cell array B, and blocks 250, 280 and 490 of the sub-cell array D can be erased at once.

When the page size is 512 bytes, the sub-cell arrays A and B can be selected simultaneously, as can the sub-cell arrays C and D.

As described above, the page size can easily be changed by selecting the sub-cell array select signal $SB_X$. If a user of a flash memory can control the signal $SB_X$ by a command supplied from outside a chip, he or she can freely change the page size according to use.

The page size can be fixed when chips are shipped. In other words, the number of sub-cell arrays selected at the same time can be determined by cutting a fuse of a chip, changing a pattern of metallization such as aluminum, or the like. Thus, a number of chips having different page sizes can easily be obtained.

The present invention is not limited to the foregoing embodiments. In the above embodiments, the memory cells are all of a NAND type. However, various memory cells such as those of a NOR type, a DINOR type, an AND type and a Virtual Ground type, can be used. In addition, a mask ROM, a DRAM and an SRAM can be used.

According to the foregoing semiconductor memory device of the present invention, a user can freely select a page size for performing write and read operations at once if the user externally inputs a command or a minor process step is added at the time of shipping. Consequently, if a standardized device having a plurality of sub-cell arrays is prepared, the write, read and erase units can be optimized according to use in each individual system design, and the optimized system performance can be achieved. Furthermore, the present invention has an advantage in compatibility of devices of different generations.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor memory device comprising:
    a memory cell array having a plurality of memory cells arranged in a matrix; and
    word lines, each word line being connected to plural memory cells and forming one page,
    wherein a number of pages selected simultaneously when a read or write operation is performed, is variable.

2. The semiconductor memory device according to claim 1, wherein said memory cells are nonvolatile memory cells each having a charge storage electrode and a gate electrode, said gate electrodes of said memory cells being control gates of said memory cells.

3. The semiconductor memory device according to claim 2, wherein a plurality of memory cells are connected in series to constitute a NAND cell structure.

4. The semiconductor memory device according to claim 1, wherein the number of pages selected simultaneously is varied by a command input from outside a chip.

5. The semiconductor memory device according to claim 1, wherein the number of pages selected simultaneously is set to be the same during read and write operations.

6. A semiconductor memory device including a memory cell array having a plurality of memory cells arranged in a matrix and word lines, each word line being connected to plural memory cells and forming one page, said device having operation modes comprising:
    a first mode in which N1 (N1 is a natural number) pages are selected simultaneously when a read or a write operation is performed;
    a second mode in which N2 (N2 is a natural number other than N1) pages are selected simultaneously when a read or a write operation is performed; and
    an i-th (i is a natural number not less than 2) mode in which Ni (Ni is a natural number) pages are selected simultaneously when a read or a write operation is performed.

7. The semiconductor memory device according to claim 6, wherein said memory cells are nonvolatile memory cells each having a charge storage electrode and a gate electrode, said gate electrodes of said memory cells being control gates of said memory cells.

8. The semiconductor memory device according to claim 7, wherein a plurality of memory cells are connected in series to constitute a NAND cell structure.

9. The semiconductor memory device according to claim 6, wherein said first to i-th modes are selected by a command input from outside a chip.

10. The semiconductor memory device according to claim 6, wherein the number of pages selected simultaneously is set to be the same during read and write operations.

11. A semiconductor memory device including a memory cell array having a plurality of memory cells arranged in a matrix and word lines, each word line being connected to plural memory cells and forming one page, said device having operation modes comprising:
    a first mode in which N1 (N1 is a natural number) pages are selected simultaneously when a read or a write operation is performed;
    a second mode in which N2 (N2 is a natural number other than N1) pages are selected simultaneously when a read or a write operation is performed; and
    an i-th (i is a natural number not less than 2) mode in which Ni (Ni is a natural number) pages are selected simultaneously when a read or a write operation is performed,
    wherein one chip includes k-th (k is a natural number not larger than i) memory cell group selected in a k-th mode and an m-th (m is a natural number other than k and not larger than i) memory cell group selected in an m-th mode.

12. The semiconductor memory device according to claim 11, wherein said memory cells are nonvolatile memory cells each having a charge storage electrode and a gate electrode, said gate electrodes of said memory cells being control gates of said memory cells.

13. The semiconductor memory device according to claim 12, wherein a plurality of memory cells are connected in series to constitute a NAND cell structure.

14. The semiconductor memory device according to claim 11, wherein said first to i-th modes are selected by a command input from outside a chip.

15. A semiconductor memory device comprising:
    a memory cell array having a plurality of memory cells arranged in a matrix and having a plurality of sub-cell arrays;
    word lines, each word line being connected to plural memory cells;
    data lines for transmitting/receiving data to/from the memory cells; and
    data circuits coupled to said data lines, for holding write data or read data of the memory cells,
    wherein each of the sub-cell arrays includes a memory cell which is coupled to a word line and a bit line, a data circuit being coupled to the bit line, and a number of sub-cell arrays to be selected simultaneously is variable when a read or a write operation is performed.

16. The semiconductor memory device according to claim 15, wherein said memory cells are nonvolatile memory cells each having a charge storage electrode and a gate electrode, said gate electrodes of said memory cells being control gates of said memory cells.

17. The semiconductor memory device according to claim 16, wherein a plurality of memory cells are connected in series to constitute a NAND cell structure.

18. The semiconductor memory device according to claim 15, wherein the number of sub-cell arrays selected simultaneously is varied by a command input from outside a chip.

19. The semiconductor memory device according to claim 15, wherein the number of sub-cell arrays selected simultaneously is set to be the same during read and write operations.

20. A semiconductor memory device comprising:
    a memory cell array having a plurality of memory cells arranged in a matrix and having a plurality of sub-cell arrays;
    word lines, each word line being connected to plural memory cells;
    data lines for transmitting/receiving data to/from the memory cells; and
    data circuits coupled to said data lines, for holding write data of the memory cells, wherein each of the sub-cell arrays includes a memory cell which is coupled to a word line and a bit line, a data circuit being coupled to the bit line, and said device has a first write mode in which write data is input to a 1·1-th data circuit of a 1·1-th sub-cell array and then data is written to a memory cell of the 1·1-th sub-cell array based on the write data input to the 1·1-th data circuit, a second write mode in which write data is input to a 2·1-th data circuit of the 2·1-th sub-cell array and a 2·2-th data circuit of a 2·2-th sub-cell array and then data is written to a memory cell of the 2·1-th sub cell array and a memory cell of the 2·2-th sub-cell array based on the write data input to the 2·1-th data circuit and the 2·2-th data circuit, and an m-th (m is a natural number not less than 2) write mode in which write data is input to m·1-th to m·m-th data circuits of m·1-th to m·m-th sub-cell arrays and then data is written to memory cells of the m·1-th to m·m-th sub-cell arrays based on the write date input to the m·1-th data circuits where a j·k-th (j and k are each a natural number, $j \geq k \geq 1$) sub-cell array is a k-th sub-cell array selected in a j-th write mode and j·k-th data circuit is included in the k-th sub-cell array.

21. The semiconductor memory device according to claim 20, wherein said memory cells are nonvolatile memory cells each having a charge storage electrode and a gate electrode, said gate electrodes of said memory cells being control gates of said memory cells.

22. The semiconductor memory device according to claim 21, wherein a plurality of memory cells are connected in series to constitute a NAND cell structure.

23. The semiconductor memory device according to claim 20, wherein said first to m-th write modes are selected by a command input from outside a chip.

24. A semiconductor memory device comprising:

a memory cell array having a plurality of memory cells arranged in a matrix and having a plurality of sub-cell arrays;

word lines, each word line being connected to plural memory cells;

data lines for transmitting/receiving data to/from the memory cells; and data circuits coupled to said data lines, for holding read data of the memory cells, wherein each of the sub-cell arrays includes a memory cell which is coupled to a word line and a bit line, a data circuit being coupled to the bit line, and said device has a first read mode in which data is read out from a memory cell of a 1·1-th sub-cell array to a 1·1-th data circuit and the data of the 1·1-th data circuit is transmitted outside a chip, a second read mode in which data is read out from the memory cells of 2·1-th and 2·2-th data sub-cell arrays to 2·1-th and 2·2-th data circuits and the data of the 2·1-th and 2·2-th data circuits is transmitted outside the chip, and an m-th (m is a natural number not less than 2) read mode in which data is read out from memory cells of m·1-th to m·m-th sub-cell arrays to m·1-th to m·m-th data circuits and the data of the m·1-th to m·m-th data circuits is transmitted outside the chip, where a j·k-th (j and k are each a natural number, $j \geq k \geq 1$) sub-cell array is a k-th sub-cell array selected in a j-th read mode and a j·k-th data circuit is included in the k-th sub-cell array.

25. The semiconductor memory device according to claim 24, wherein said memory cells are nonvolatile memory cells each having a charge storage electrode and a gate electrode, said gate electrodes of said memory cells being control gates of said memory cells.

26. The semiconductor memory device according to claim 25, wherein a plurality of memory cells are connected in series to constitute a NAND cell structure.

27. The semiconductor memory device according to claim 24, wherein said first to m-th read modes are selected by a command input from outside the chip.

28. A semiconductor memory device comprising:

a memory cell array having a plurality of memory cells arranged in a matrix;

word lines, each word line being connected to plural memory cells;

data lines for transmitting/receiving data to/from the memory cells; and data circuits coupled to said data lines, for holding write data or read data of the memory cells, wherein each of the sub-cell arrays includes a memory cell which is coupled to a word line and a bit line, a data circuit being coupled to the bit line, and first write data is input to a 1·1-th data circuit of a 1·1-th sub-cell array and data is written to a memory cell of the 1·1-th sub-cell array based on the first write data input to the 1·1-th data circuit, second write data is input to a 2·1-th data circuit of a 2·1-th sub-cell array and a 2·2-th data circuit of a 2·2-th sub cell array and data is written to a memory cell of the 2·1-th sub-cell array and a memory cell of the 2·2-th sub-cell array based on the second write data input to the 2·1-th data circuit and the 2·2-th data circuit, n-th (n is a natural number not less than 2) write data is input to n·1-th to n·n-th data circuits of n·1-th to n·n-th sub-cell arrays and data is written to memory cells of the n·1-th to n·n-th sub-cell arrays based on the n-th write data input to the n·1-th to n·n-th data circuits where a j·k-th (j and k are each a natural number, $j \geq k \geq 1$) sub-cell array is a k-th sub-cell array selected in a j-th write mode and a j·k-th data circuit is included in the k-th sub-cell array.

29. The semiconductor memory device according to claim 28, wherein said memory cells are nonvolatile memory cells each having a charge storage electrode and a gate electrode, said gate electrodes of said memory cells being control gates of said memory cells.

30. The semiconductor memory device according to claim 29, wherein a plurality of memory cells are connected in series to constitute a NAND cell structure.

31. A semiconductor memory device comprising:

a memory cell array having a plurality of memory cells arranged in a matrix and having a plurality of sub-cell arrays; and word lines, each word line being connected to plural memory cells and forming one page;

wherein each of the sub-cell arrays has at least one page respectively, and a number of pages selected from said plurality of sub-cell arrays simultaneously when a read or a write operation is performed, is variable.

32. The semiconductor memory device according to claim 31, wherein said memory cells are nonvolatile memory cells each having a charge storage electrode and a gate electrode, said gate electrodes of said memory cells being control gates of said memory cells.

33. The semiconductor memory device according to claim 32, wherein a plurality of memory cells are connected in series; to constitute a NAND cell structure.

34. The semiconductor memory device according to claim 31, wherein the number of pages selected simultaneously is varied by a command input from outside a chip.

35. The semiconductor memory device according to claim 31, wherein the number of pages selected simultaneously is set to be the same during read and write operations.

* * * * *

UNITED STATES PATENT AND TRADEMARK OFFICE
CERTIFICATE OF CORRECTION

PATENT NO. : 5,986,933
DATED : November 16, 1999
INVENTOR(S) : Ken Takeuchi, et al Page 1 of 2

It is certified that error appears in the above-identified patent and that said Letters Patent is hereby corrected as shown below:

In Claim 15, column 16, line 40,
    after "cell" insert --,--, delete "which is coupled to", after "line" insert --,--, delete "and"; and insert --and-- after "line,"; and
        line 41,
    delete "being coupled to the bit line".

In Claim 20, column 17, line 2,
    after "cell" insert --,--, delete "which is coupled to", after "line" insert --,--; delete "and"; and insert --and-- after "line,";
        line 3,
    delete "being coupled to the bit line";
        line 8,
    delete "the" and insert --a-- therein; and
        line 17,
    after "m-1-th" insert --to m-m-th--.

In Claim 28, column 18, line 6,
    after "matrix" insert --and having a plurality of sub-cell arrays--
        line 15,
    after "cell" insert --,--, delete "which is coupled to", after "line" insert --,--; delete "and"; and insert --and-- after "line";
        line 16,
    delete "being coupled to the bit line"; and

UNITED STATES PATENT AND TRADEMARK OFFICE
CERTIFICATE OF CORRECTION

PATENT NO. : 5,986,933
DATED : November 16, 1999
INVENTOR(S) : Ken Takeuchi, et al It is certified that error appears in the above-identified patent and that said Letters Patent is hereby corrected as shown below:

line 34,
after "array," insert --one chip includes a p-th (p is a natural number not larger than j) memory cell group that stores the p-th write date, and q-th (q is a natural number other than p and not larger than j) memory cell group that stores the q-th write date--.

Signed and Sealed this

Fifteenth Day of August, 2000

Attest:

Q. TODD DICKINSON

*Attesting Officer*      *Director of Patents and Trademarks*